United States Patent
Yoo

(10) Patent No.: US 10,504,442 B2
(45) Date of Patent: Dec. 10, 2019

(54) DISPLAY DEVICE AND GATE DRIVING CIRCUIT THEREOF, CONTROL METHOD AND VIRTUAL REALITY DEVICE

(71) Applicant: LG Display Co., Ltd., Seoul (KR)

(72) Inventor: Ooksang Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 152 days.

(21) Appl. No.: 15/859,087

(22) Filed: Dec. 29, 2017

(65) Prior Publication Data
US 2019/0005884 A1    Jan. 3, 2019

(30) Foreign Application Priority Data

Jun. 30, 2017  (KR) .................. 10-2017-0083276

(51) Int. Cl.
  *G09G 3/3258*   (2016.01)
  *G06F 3/01*    (2006.01)
  (Continued)

(52) U.S. Cl.
  CPC ........... *G09G 3/3258* (2013.01); *G06F 3/011* (2013.01); *G09G 3/3233* (2013.01);
  (Continued)

(58) Field of Classification Search
  CPC .. G09G 3/20; G09G 3/2085; G09G 2300/026; G09G 2300/0408;
  (Continued)

(56) References Cited

U.S. PATENT DOCUMENTS

2006/0070274 A1* 4/2006 Maack ............. G02F 1/134336
                                                        40/447
2014/0043306 A1* 2/2014 Min .................... G09G 3/3685
                                                        345/204
(Continued)

FOREIGN PATENT DOCUMENTS

CN      106875890 A    6/2017
JP      2004252092 A   9/2004
(Continued)

OTHER PUBLICATIONS

Office Action dated Dec. 28, 2018 with English translation issued in the corresponding Taiwanese Application No. 106145419, pp. 1-18.
(Continued)

*Primary Examiner* — Nelson M Rosario
(74) *Attorney, Agent, or Firm* — Polsinelli PC

(57) ABSTRACT

A display device and a gate driving circuit are disclosed. The display device includes a display panel comprising a plurality of data lines, a plurality of gate lines and a plurality of pixels arranged in a matrix in which the plurality of data lines and the plurality of gate lines intersect with each other; a system controller that sends image data of an input image to a display driver; and the display driver that drives the display panel by decreasing the number of shifts in gate signals applied to gate lines in a second area as compared with a first area. The first area is an area in which the input image is to be displayed in a first resolution in the display panel, and the second area is an area in which the input image is to be displayed in a second resolution smaller than the first resolution in the display panel.

18 Claims, 21 Drawing Sheets

(51) Int. Cl.
*H01L 27/32* (2006.01)
*G09G 3/3233* (2016.01)
*G09G 3/3266* (2016.01)
*G02B 27/01* (2006.01)

(52) U.S. Cl.
CPC ....... *G09G 3/3266* (2013.01); *H01L 27/3276* (2013.01); *G02B 27/0172* (2013.01); *G09G 2300/0819* (2013.01); *G09G 2300/0842* (2013.01); *G09G 2300/0861* (2013.01); *G09G 2310/0205* (2013.01); *G09G 2310/0264* (2013.01); *G09G 2310/0286* (2013.01); *G09G 2320/0261* (2013.01); *G09G 2320/045* (2013.01); *G09G 2340/0414* (2013.01); *G09G 2340/0435* (2013.01)

(58) Field of Classification Search
CPC ... G09G 2300/0413; G09G 2300/0426; G09G 2300/043; G09G 2310/0202; G09G 2310/0278; G09G 2310/0281; G09G 2310/08; G09G 2320/0247
See application file for complete search history.

(56) References Cited

U.S. PATENT DOCUMENTS

2016/0117965 A1* 4/2016 Lee .................. G02F 1/136286
                                                      345/209
2016/0274365 A1    9/2016  Bailey et al.
2017/0025068 A1    1/2017  Jeoung et al.

FOREIGN PATENT DOCUMENTS

| JP | 2004302065 A | 10/2004 |
| JP | 2008176159 A | 7/2008 |
| JP | 2008309922 A | 12/2008 |
| JP | 2010107582 A | 5/2010 |
| JP | 2014153491 A | 8/2014 |
| KR | 10-2016-0140221 A | 12/2016 |
| TW | 201131538 A | 9/2011 |
| TW | 201232501 A | 8/2012 |
| TW | 201627836 A | 8/2016 |
| TW | 201634974 A | 10/2016 |
| TW | M535856 A | 1/2017 |
| WO | 2017090203 A1 | 6/2017 |
| WO | 2018/035045 A1 | 2/2018 |

OTHER PUBLICATIONS

Combined Search and Examination Report dated Jun. 21, 2018 issued in the corresponding United Kingdom Patent Application No. GB1721660.7, pp. 1-7.
Office Action dated Sep. 4, 2018 with machine translation issued in the corresponding Japanese Patent Application No. 2017-247339, 10 Pages.
Office Action dated May 21, 2019 with English translation issued in the corresponding Japanese Application No. 2017-247339, 6 Pages.

* cited by examiner

FIG. 4
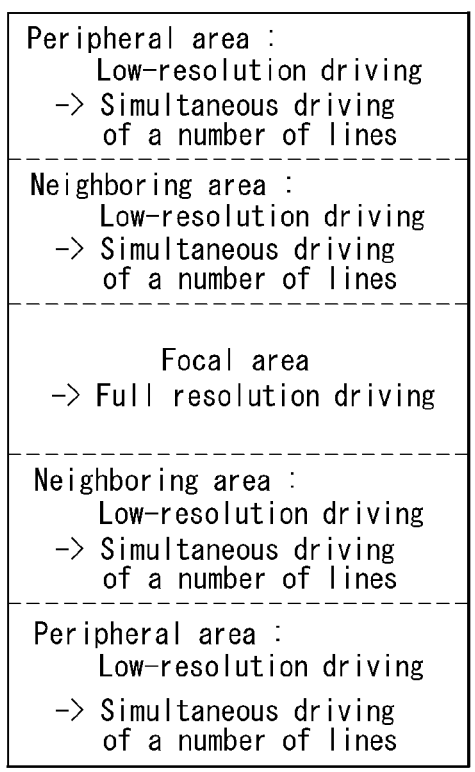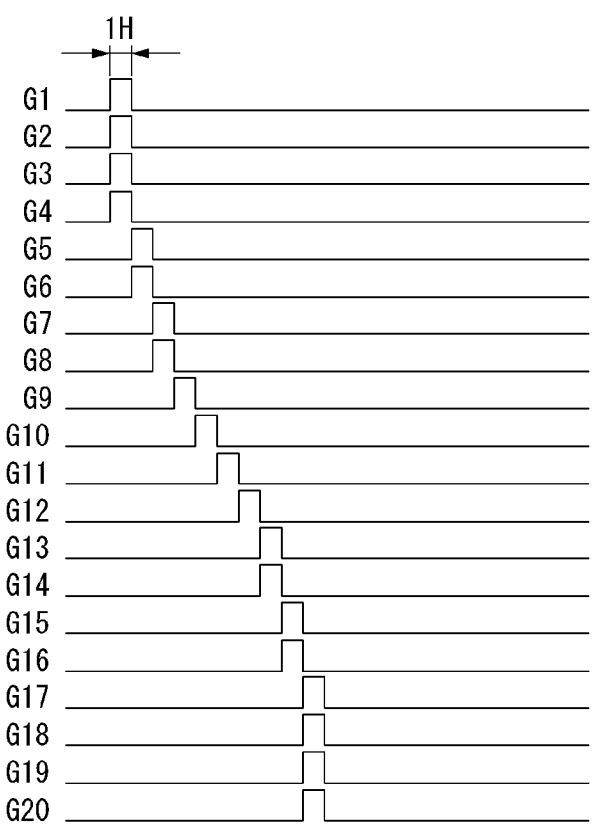

FIG. 5
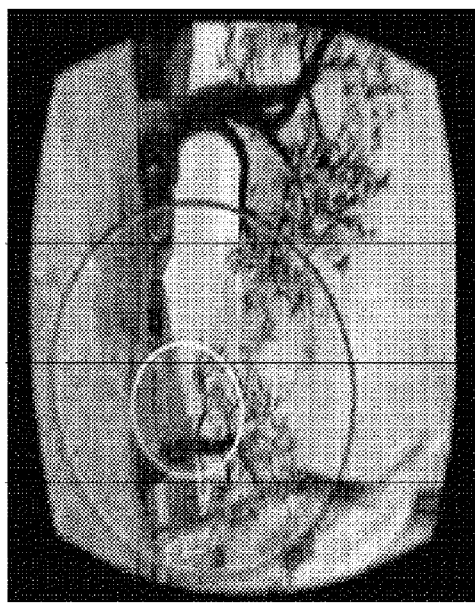
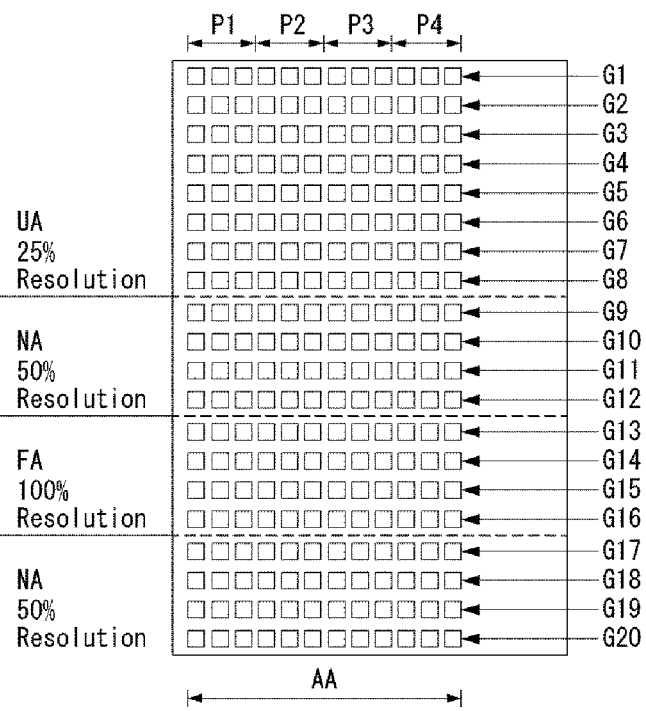

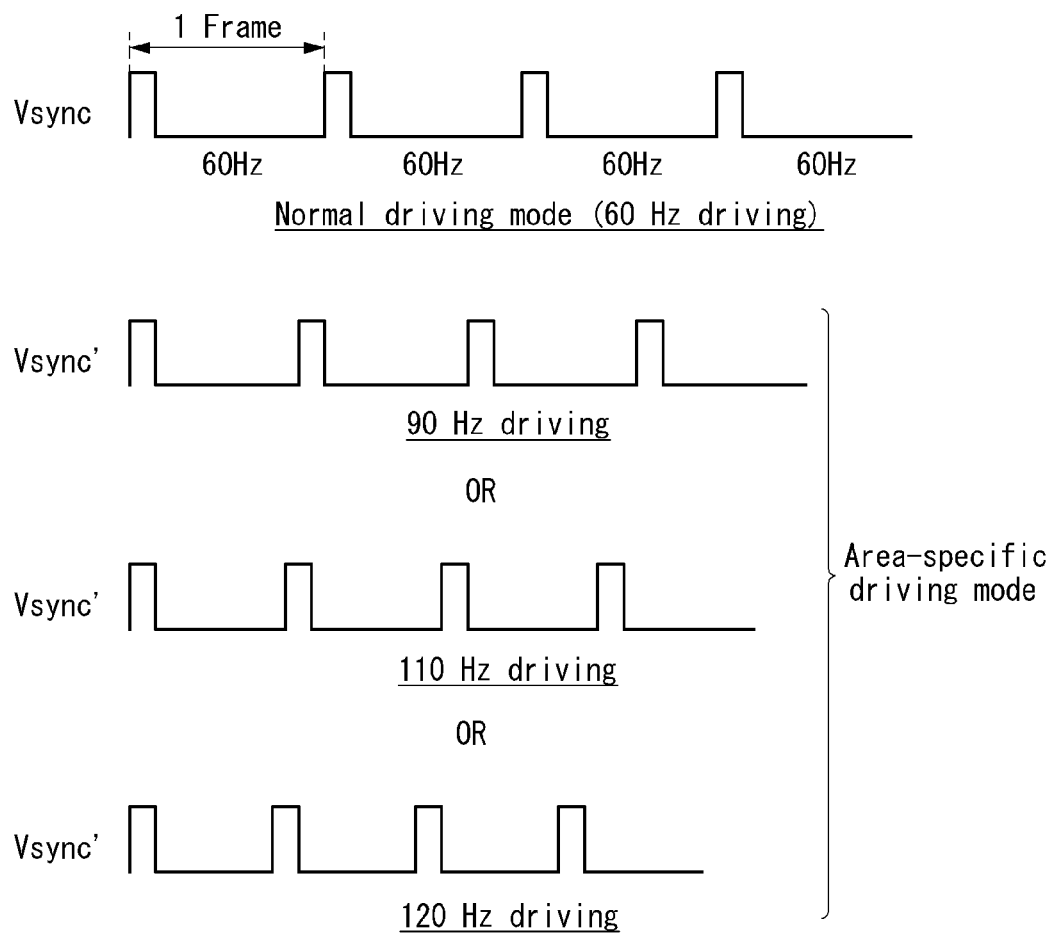

FIG. 10C
60Hz -> 120Hz
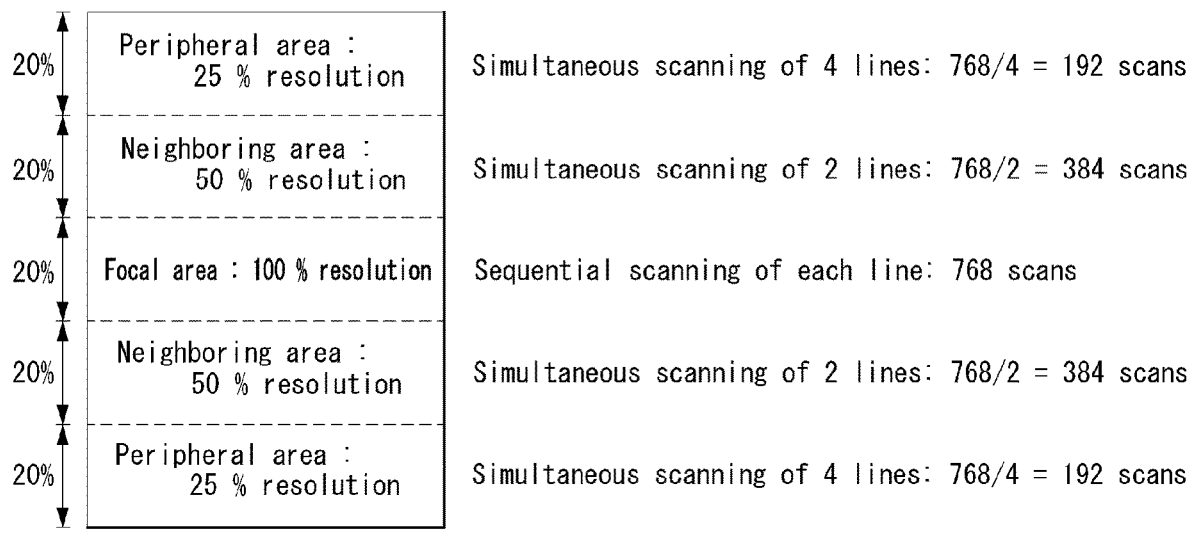
UHD Panel : 3840 X 2160
Total scan count: 1920 scans
-> Driving at 120 Hz frame rate
FIG. 11
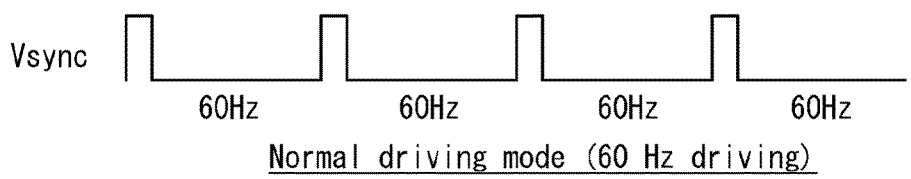
Normal driving mode (60 Hz driving)
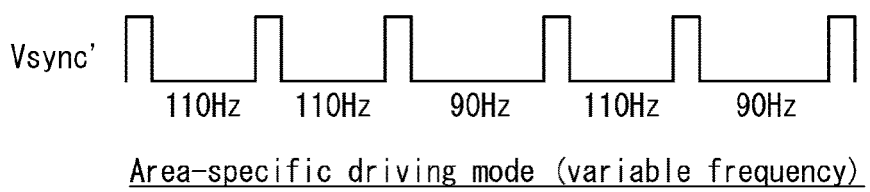
Area-specific driving mode (variable frequency)

FIG. 13
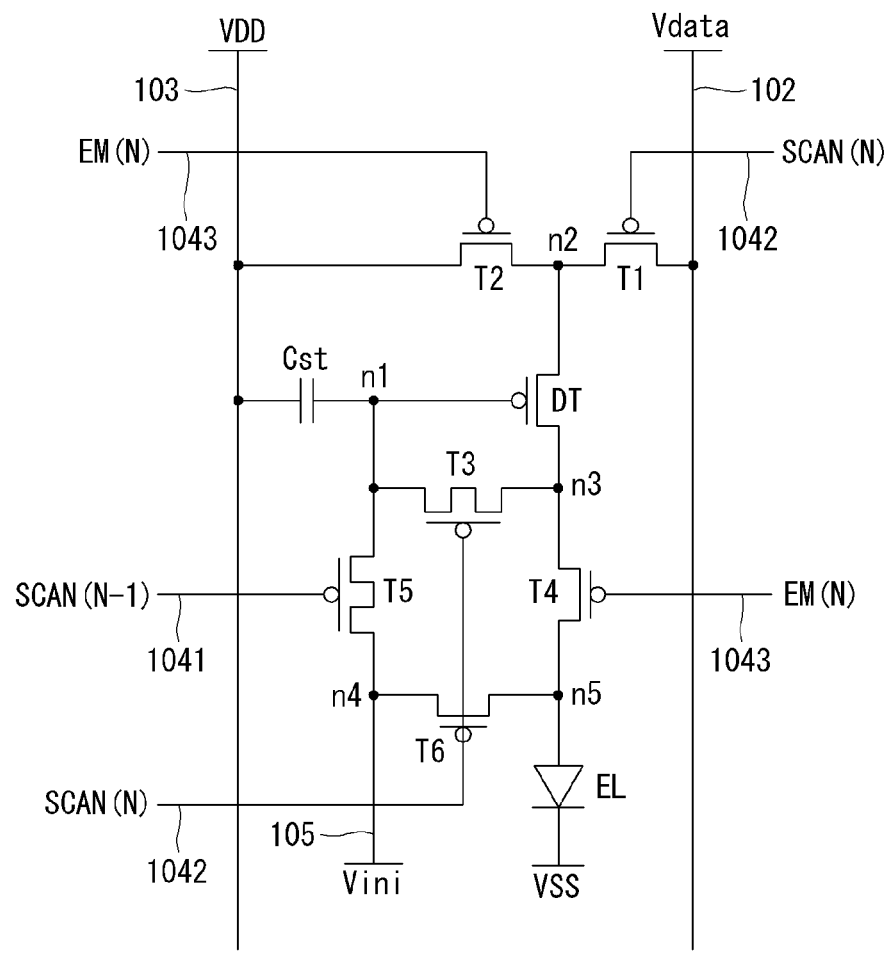
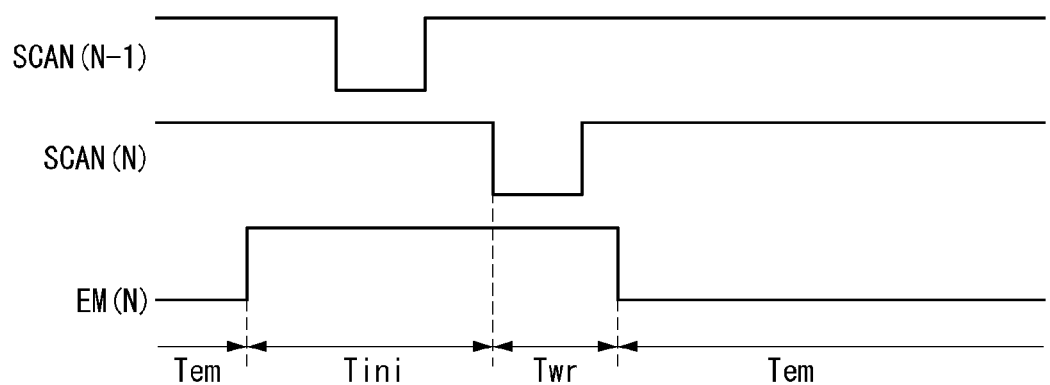

FIG. 16
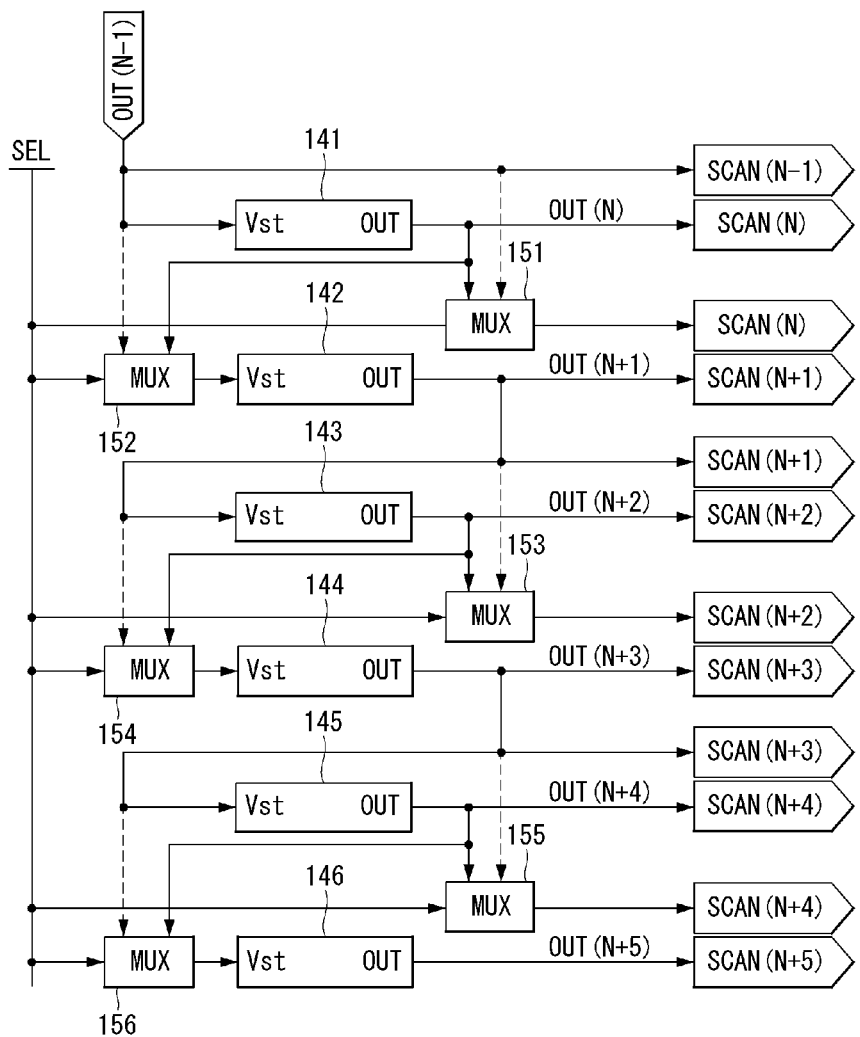
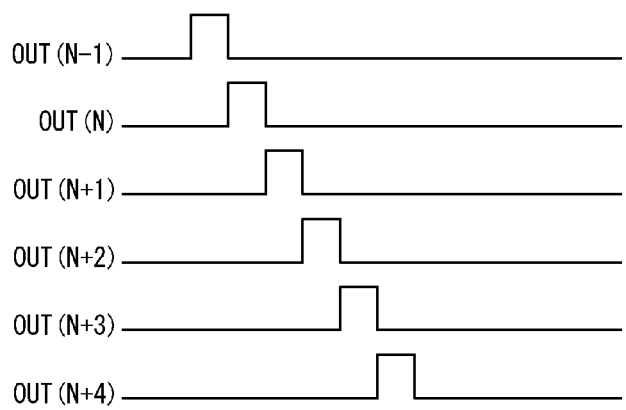

FIG. 17
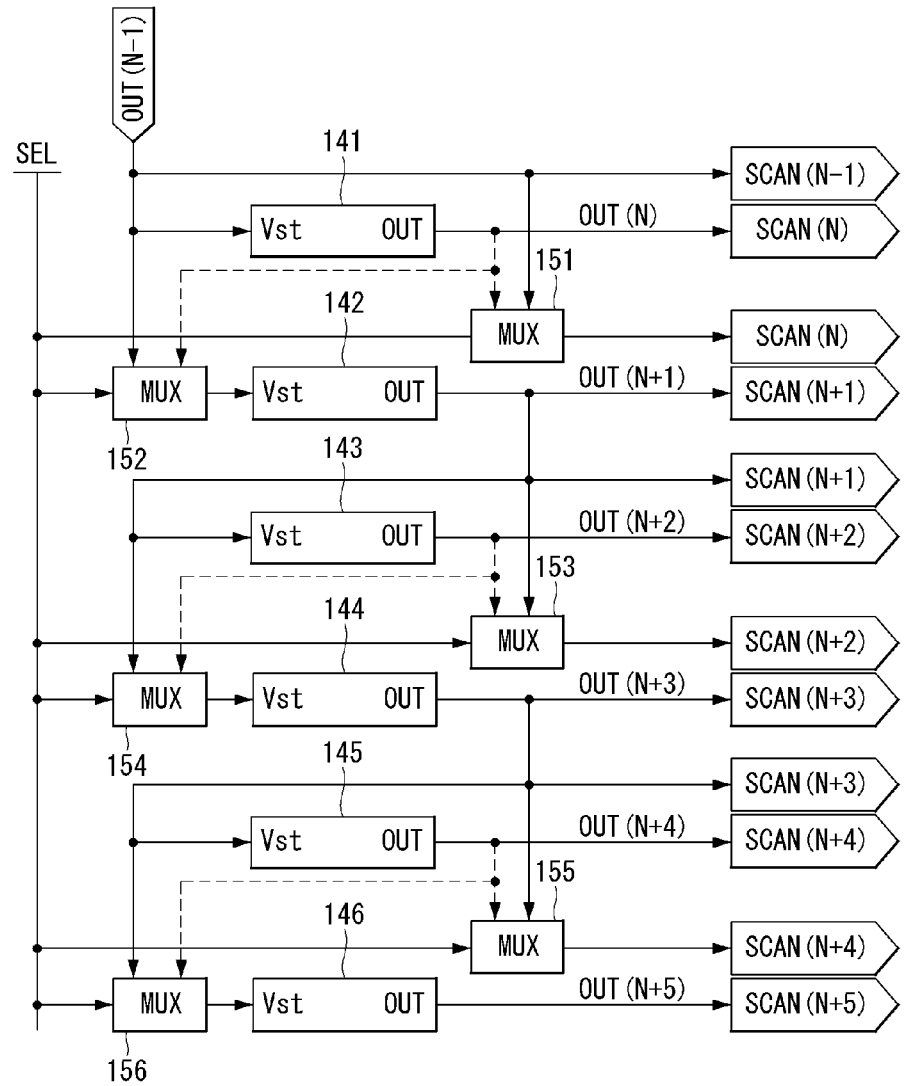
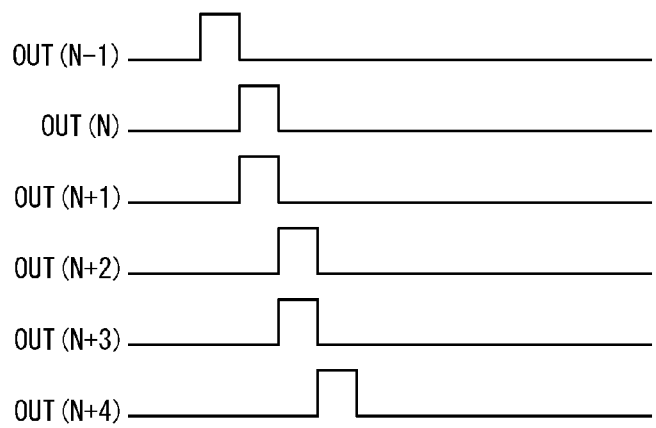

FIG. 18
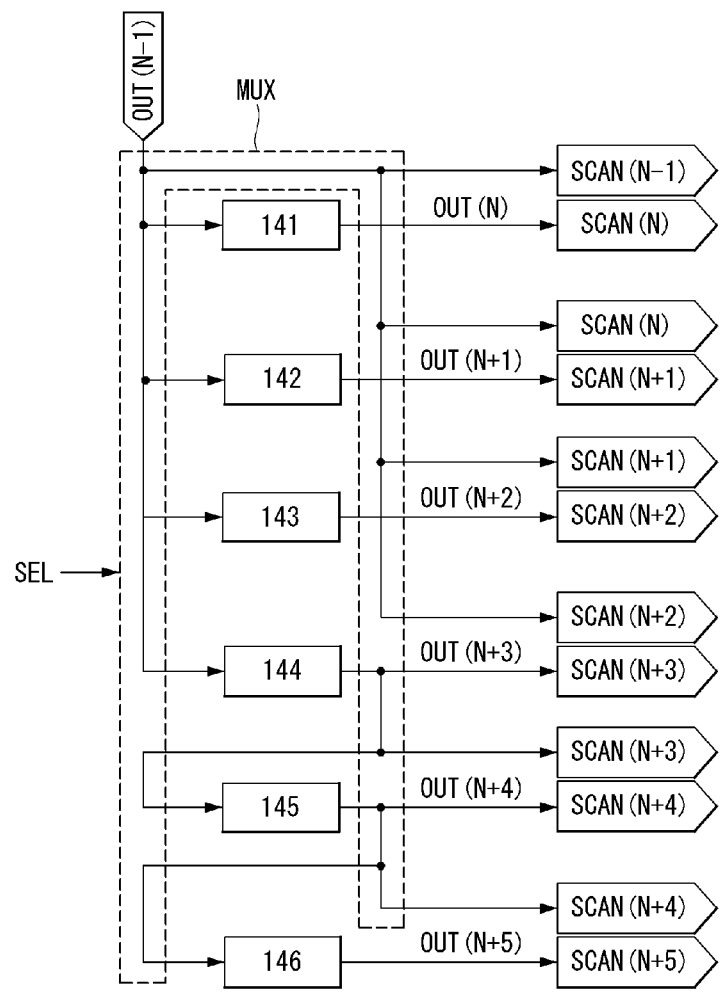
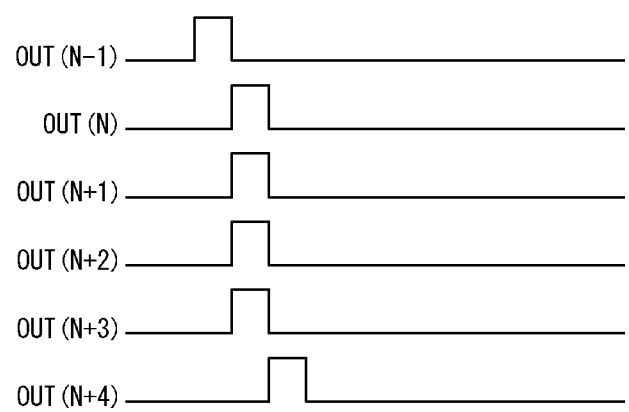

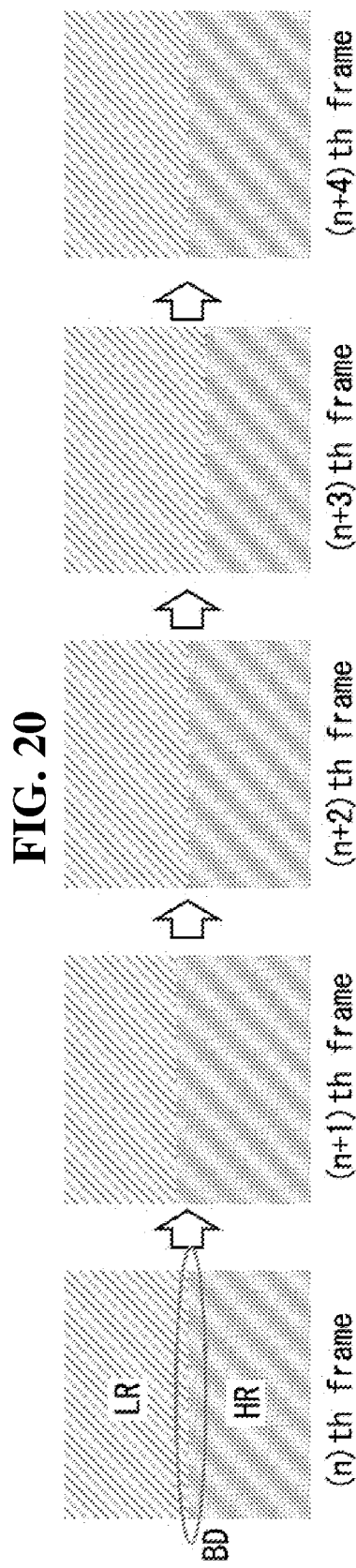

DISPLAY DEVICE AND GATE DRIVING CIRCUIT THEREOF, CONTROL METHOD AND VIRTUAL REALITY DEVICE

CROSS-REFERENCE TO RELATED APPLICATION

This application claims the benefit of Korean Patent Application No. 10-2017-0083276 filed on Jun. 30, 2017, the entire contents of which is incorporated herein by reference for all purposes as if fully set forth herein.

BACKGROUND

Field of the Disclosure

The present disclosure relates to a display device, more particularly, to a display device applicable to virtual reality devices and a gate driving circuit thereof.

Description of the Background

Virtual reality technology is developing most rapidly in military, architecture, tourism, movies, multimedia, gaming, etc. Virtual reality refers to a specific environment or situation that replicates a real environment through the use of three-dimensional image technology. Devices for implementing virtual reality technology may be categorized into virtual reality (VR) devices and augmented reality (AR) devices. These devices include various forms of display devices under development, such as HMD (head mounted display), FMD (face mounted display), and EGD (eye glasses-type display).

FIG. 1 shows an example of a virtual reality device 6. A user sees a stereoscopic image displayed on a small display panel 2 through a fisheye lens 4.

In virtual reality devices, picture quality is greatly affected by total latency, which is the time from an image source until displaying the image on the display panel. For example, image data generated from a graphic image processor of a VR system is written to the pixels on the display panel through a display driver. The graphic image processor may be implemented as a GPU (graphic processing unit). Data transmitted from the GPU to the display device is displayed on the pixels after a total latency, which equals to the sum of a processing delay in the system and a delay in the display device. System processing time is the time the GPU takes to process an image. The display device's delay is the sum of a delay in the display driver and a pixel response delay. If the total latency is long, the user may perceive motion judder and motion blur. This increases the user's fatigue, as well as degrading image quality.

SUMMARY

The present disclosure is directed to a display device which improves image quality by minimizing delays until data is displayed, and a gate driving circuit thereof.

In one aspect, there is provided a display device including a display panel comprising a plurality of data lines, a plurality of gate lines and a plurality of pixels arranged in a matrix in which the plurality of data lines and the plurality of gate lines intersect with each other; a system controller that sends image data of an input image to a display driver; and the display driver that drives the display panel by decreasing the number of shifts in gate signals applied to gate lines in a second area as compared with a first area. The first area is an area in which the input image is to be displayed in a first resolution in the display panel, and the second area is an area in which the input image is to be displayed in a second resolution smaller than the first resolution in the display panel.

In one aspect, there is provided a gate driving circuit including a display panel of the display device comprising a first area in which an input image is to be displayed in a first resolution and a second area in which the input image is to be displayed in a second resolution smaller than the first resolution.

The gate driving circuit includes a shift register that shifts pulses of gate signals and sequentially supplying the gate signals to gate lines, the shift register comprising a plurality of stages connected as a cascade through carry signal wiring; and a multiplexer that switches a path of an output signal of each of the plurality of stages. The multiplexer provides the output signal of a previous stage to start terminals of a first number of next stages as an carry signal, and in the second area, the multiplexer provides the output signal of a previous stage to start terminals of a second number of next stages as an carry signal, the first number corresponding to the first resolution, the second number corresponding to the second resolution.

In one aspect, there is provided a method for controlling a gate driving circuit for a display device, a display panel of the display device comprising a first area in which an input image is to be displayed in a first resolution and a second area in which the input image is to be displayed in a second resolution smaller than the first resolution, wherein the gate driving circuit.

The method for controlling a gate driving circuit for a display device, a display panel of the display device comprising a first area in which an input image is to be displayed in a first resolution and a second area in which the input image is to be displayed in a second resolution smaller than the first resolution. The gate driving circuit comprises a shift register that shifts pulses of gate signals and sequentially supplying the gate signals to gate lines, the shift register comprising a plurality of stages connected as a cascade through carry signal wiring; and a multiplexer that switches a path of an output signal of each of the plurality of stages.

The method includes controlling the multiplexer to provide, in the first area, the output signal of a previous stage to start terminals of a first number of next stages as an carry signal; and controlling the multiplexer to provide, in the second area, the output signal of a previous stage to start terminals of a second number of next stages as an carry signal, the first number corresponding to the first resolution, the second number corresponding to the second resolution.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings:

FIGS. 4 and 5 are views showing gate signals in a focal area, a neighboring area, and a peripheral area;

FIG. 9 is a waveform chart showing a vertical synchronization signal generated at an input frame rate and vertical synchronization signals generated at the driving frame rate of the display panel;

FIGS. 10A to 10C are views each showing an example of variation of the driving frame rate of the display panel;

FIG. 11 is a waveform diagram showing an example of variation of the driving frame rate of the display panel;

FIG. 13 is a waveform chart showing an example of a pixel circuit and gate signals for driving the pixel circuit;

FIG. 16 is a circuit diagram showing in detail a circuit in a gate driver that outputs gate signals to the gate lines in the focal area;

FIG. 17 is a circuit diagram showing in detail a circuit in a gate driver that outputs gate signals to the gate lines in the neighboring area;

FIG. 18 is a circuit diagram showing in detail a circuit in a gate driver that outputs gate signals to the gate lines in the peripheral area; and FIGS. 19 and 20 are views showing an example of how an image is processed to keep the boundary between adjacent areas from being visible.

DETAILED DESCRIPTION

Figure 1:
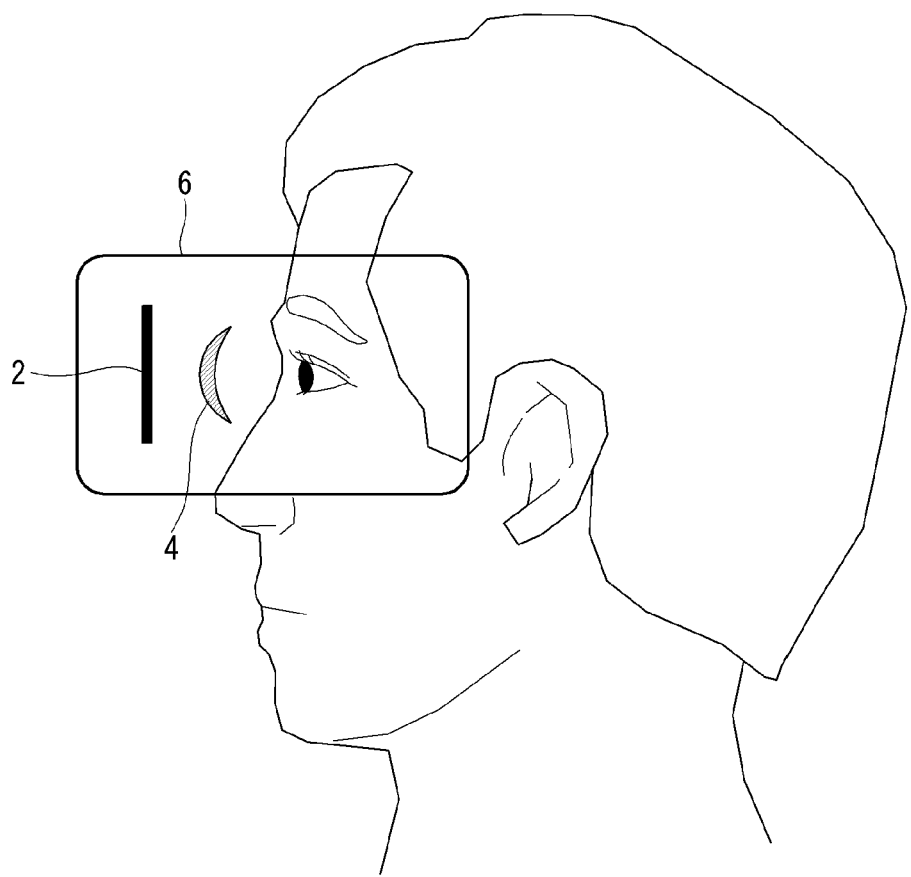
FIG. 1 is a view schematically showing a virtual reality device.

Various aspects and features of the present disclosure and methods of accomplishing them may be understood more readily by reference to the following detailed descriptions of exemplary aspects and the accompanying drawings. The present disclosure may, however, be embodied in many different forms and should not be construed as being limited to the exemplary aspects set forth herein. Rather, these exemplary aspects are provided so that this disclosure will be thorough and complete and will fully convey the concept of the present disclosure to those skilled in the art, and the scope of the present disclosure is defined by the appended claims.

The shapes, sizes, proportions, angles, numbers, etc. shown in the figures to describe the exemplary aspects of the present disclosure are merely examples and not limited to those shown in the figures. Like reference numerals denote like elements throughout the specification. In describing the present disclosure, detailed descriptions of related well-known technologies will be omitted to avoid unnecessarily obscuring the present disclosure.

When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

It will be understood that, although the terms first, second, etc., may be used to describe various elements, the functions or structures of these elements should not be limited by these terms.

The features of various exemplary aspects of the present disclosure may be coupled or combined with one another either partly or wholly, and may technically interact or work together in various ways. The exemplary aspects may be carried out independently or in connection with one another.

In an electroluminescence display of the present disclosure, a pixel circuit may comprise one or more of an n-type TFT (NMOS) and a p-type TFT (PMOS). A TFT is a three-electrode device with gate, source, and drain. The source is an electrode that provides carriers to the transistor. The carriers in the TFT flow from the source. The drain is an electrode where the carriers leave the TFT. That is, the carriers in the TFT flow from the source to the drain. In the case of the n-type TFT, the carriers are electrons, and thus the source voltage is lower than the drain voltage so that the electrons flow from the source to the drain. In the n-type TFT, current flows from the drain to the source. In the case of the p-type TFT (PMOS), the carriers are holes, and thus the source voltage is higher than the drain voltage so that the holes flow from the source to the drain. In the p-type TFT, since the holes flow from the source to the drain, current flows from the source to the drain. It should be noted that the source and drain of the TFT are not fixed in position. For example, the source and drain are interchangeable depending on the applied voltage. Accordingly, the disclosure should not be limited by the source and drain of the TFT. In the following description, the source and drain of the TFT will be referred to as first and second electrodes.

A gate signal applied to the pixel circuit swings between gate-on voltage and gate-off voltage. The gate-on voltage is set higher than the threshold voltage of the TFT, and the gate-off voltage is set lower than the threshold voltage of the TFT. The TFT turns on in response to the gate-on voltage and turns off in response to the gate-off voltage. In the n-type TFT, the gate-on voltage may be gate-high voltage VGH, and the gate-off voltage may be gate-low voltage VGL. In the p-type TFT, the gate-on voltage may be gate-low voltage VGL, and the gate-off voltage may be gate-high voltage VGH.

Hereinafter, exemplary aspects of the present disclosure will be described in detail with reference to the attached drawings. Throughout the specification, like reference numerals denote substantially like components. In describing the present disclosure, a detailed description of known functions or configurations related to the present disclosure will be omitted when it is deemed that it may unnecessarily obscure the subject matter of the present disclosure.

Figure 2:
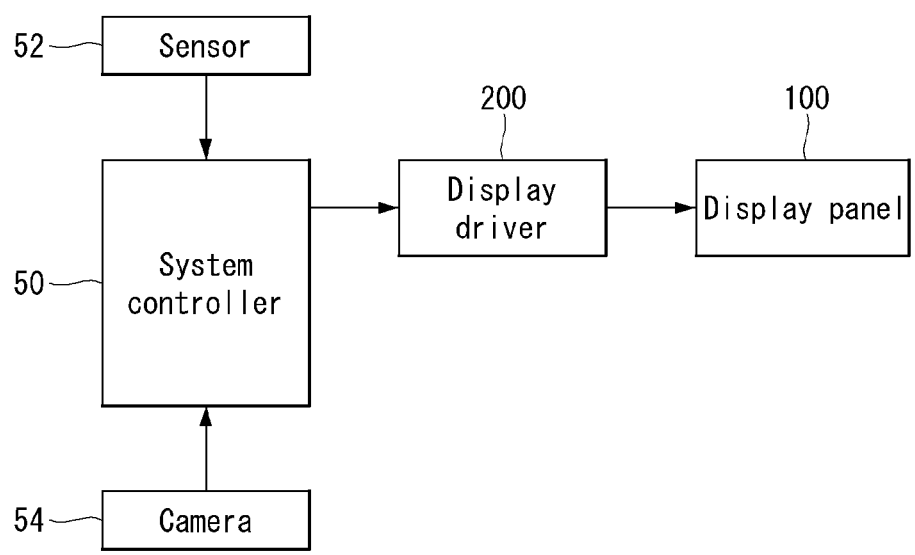
FIG. 2 is a block diagram showing a display device according to an exemplary aspect of the present disclosure.
Figure 3:
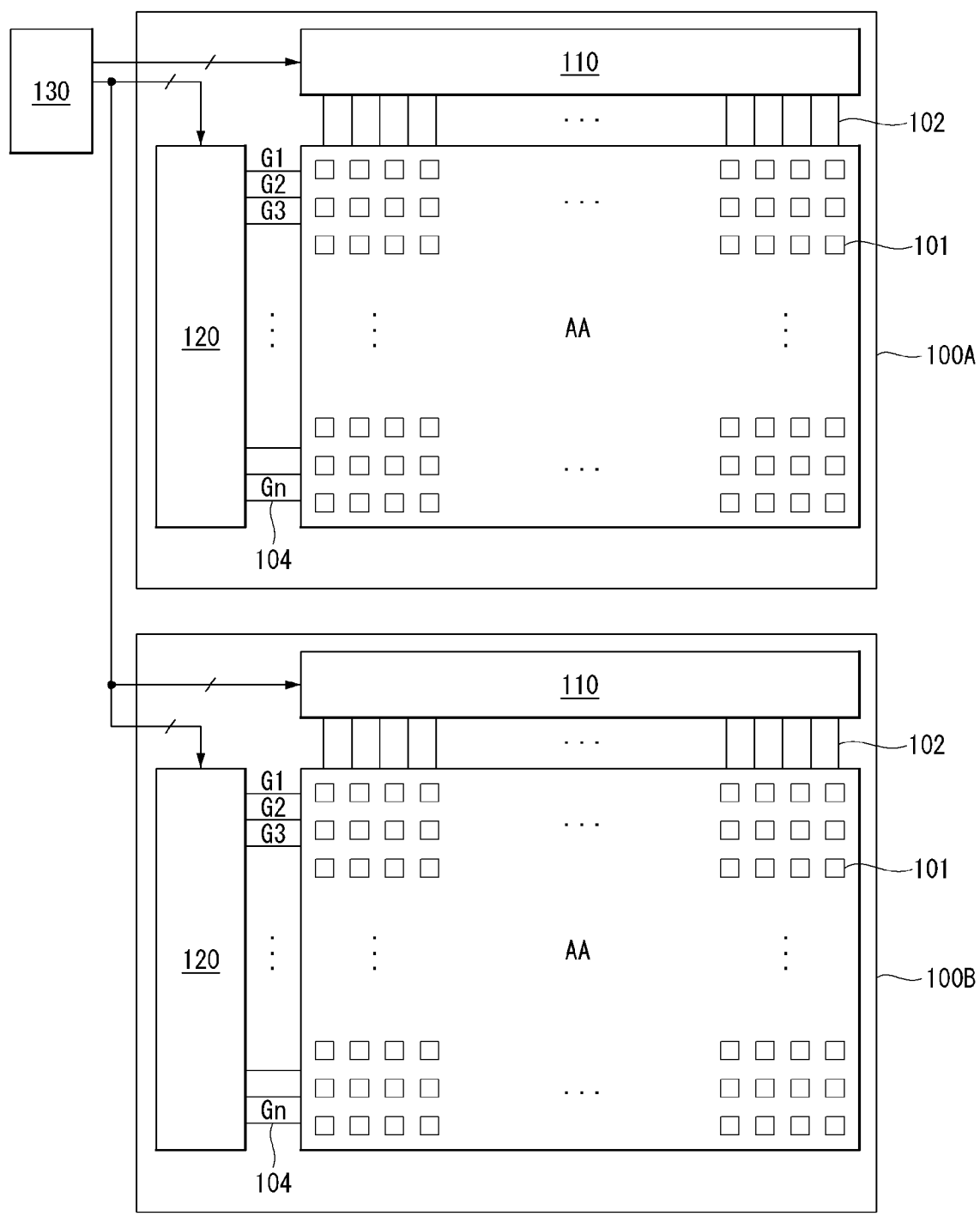
FIG. 3 is a view showing in detail the display driver and display panel of FIG. 2.

Referring to FIGS. 2 and 3, a display device of present disclosure comprises a display panel 100, 100A, and 100B, a system controller 50, a display driver 200, etc.

The system controller 50 may be, but not limited to one of the following: a TV (television) system, a computer system, a set-top box, a navigation system, a DVD player, a Blu-ray player, a home theater system, a mobile device system, a wearable device system, or a virtual/augmented reality system. Now, the system controller 50 will be described with respect to, but not limited to, a virtual reality device system.

The system controller 50 is connected to a sensor 52, a camera 54, etc. The system controller 50 further comprises an external device interface connected to memory or an external video source, a user interface receiving a user command, and a power supply part generating power. The external device interface, the user interface, and the power supply part are omitted in the drawings. The system controller 50 adjusts the resolutions of a focal area and its neighboring area by using a graphic image processor such as a GPU that performs image processing on input images. The external device interface may be implemented by well-known various interface modules such as universal serial bus (USB) and high-definition multimedia interface (HDMI).

The system controller 50 sends image data to the display driver 200. The system controller 50 estimates a focal area toward which the user's gaze is directed by analyzing image data from the camera 54 capturing the user's left and right eyes by means of a preset eye tracking algorithm. The system controller 50 adjusts the resolution of an input image in the focal area, the neighboring area around the focal area, and a peripheral area outside the neighboring area by using a foveated rendering algorithm.

The focal area is an area in which an image is represented at a first resolution, and the neighboring area is an area in which an image is represented at a second resolution lower than the first resolution. The peripheral area is an area in which an image is represented at a third resolution lower than the second resolution. The system controller 50 converts the resolution of an input image to match the resolutions of the focal area, neighboring area, and peripheral area by using a scaler. For example, if the resolution of data in the focal area is 100% (full resolution), the system controller 50 scales down the resolution of image data to be displayed in the neighboring area to 50% and the resolution of image data to be displayed in the peripheral area to 25%. In the case of stereoscopic images, the system controller 50 converts the resolution of 1 frame data for left-eye image data and right-eye image data, individually, in the same way as described above.

The sensor 52 comprises various sensors such as a gyro-sensor, an accelerometer, etc. The sensor 52 sends outputs of various sensors to the system controller 50. The system controller 50 receives outputs from the sensor 52 and controls the operation of the display device.

The display panel 100 may be implemented as a display panel on which an image is displayed in a flat-panel display such as a liquid crystal display (LCD), a field emission display (FED), or an electroluminescence display. The electroluminescence display may be classified as an inorganic light-emitting display or an organic light-emitting display depending on the material of an emission layer. An example of the inorganic light-emitting display includes a quantum dot display. Hereinafter, a display device will be described with respect to, but not limited to, an organic light-emitting display. The display panel 100 is divided into a first display panel 100A displaying left-eye image data and a second display panel 100B displaying right-eye image data.

The first display panel 100A may be, but not limited to, a left-eye display panel of a virtual reality device, and the second display panel 100B may be a right-eye display panel of the virtual reality device. A display device of the present disclosure may be implemented by one display panel or two or more display panels depending on the purpose of the display device.

Each of the display panels 100A and 100B comprises data lines to which data signals of image data are applied, gate lines (or scan lines) to which gate signals are applied, and pixels arranged in a matrix of the data lines and gate lines intersecting each other. An image is displayed on a pixel array AA arranged on the screen of the display panel.

Each pixel may be divided into sub-pixels 101 such as a red sub-pixel, a green sub-pixel, and a blue sub-pixel for color representation. Each pixel may further comprise a white sub-pixel. In the case of an organic light-emitting display, each sub-pixel 101 may comprise, but not limited to, the pixel circuit shown in FIG. 13.

The display driver 200 may drive the display panel 100 in a slow driving mode, a normal driving mode, and an area-specific driving mode.

In the slow driving mode, power consumption is lowered by decreasing the driving frame rate of the display panel 100. The display driver 200 may decrease the frame rate to 1 Hz to 30 Hz in order to reduce the frame rate in slow driving mode. In the slow driving mode, an input image is analyzed, and if there is no change in the input image for a preset period of time, the power consumption of the display device is lowered. In the slow driving mode, when a still image is on for more than a certain amount of time, the intervals at which data is written to the pixels are lengthened by decreasing the frame rate of the pixels, thereby reducing power consumption. The slow driving mode is not limited to when a still image is input. For instance, when the display device operates in standby mode or no user command or input image is input into the display panel drive circuit for more than a given amount of time, the display panel drive circuit may operate in slow driving mode.

In the normal driving mode, the driving frame rate of the display panel 100 is constant, and the number of gate shifts is uniform across the screen. In the normal driving mode, gate signals are shifted by an amount equal to the vertical resolution of the screen, and an image is displayed at the full resolution of the display panel across the screen.

In the area-specific driving mode, areas of different resolutions on the screen, such as a focal area toward which the user's gaze is directed and a neighboring area around the focal area, are distinguished. In addition to the focal area and the neighboring area on the screen, a peripheral area may be set around the neighboring area. In the area-specific driving mode, the display driver 200 displays an image on the display panel 100 at a lower resolution in the neighboring area than in the focal area. The display driver 200 may increase the frame rate to be at a frequency higher than the input frame rate by decreasing the number of shifts in gate signals in the neighboring area and the peripheral area, compared to that in the focal area. Thus, in the area-specific driving mode, the latency until data is written to the pixels on the display panel 100 can be reduced, thereby improving picture quality and decreasing the user's fatigue. Now, the operation of the display driver 200 will be described with respect to the area-specific driving mode.

Figure 7:
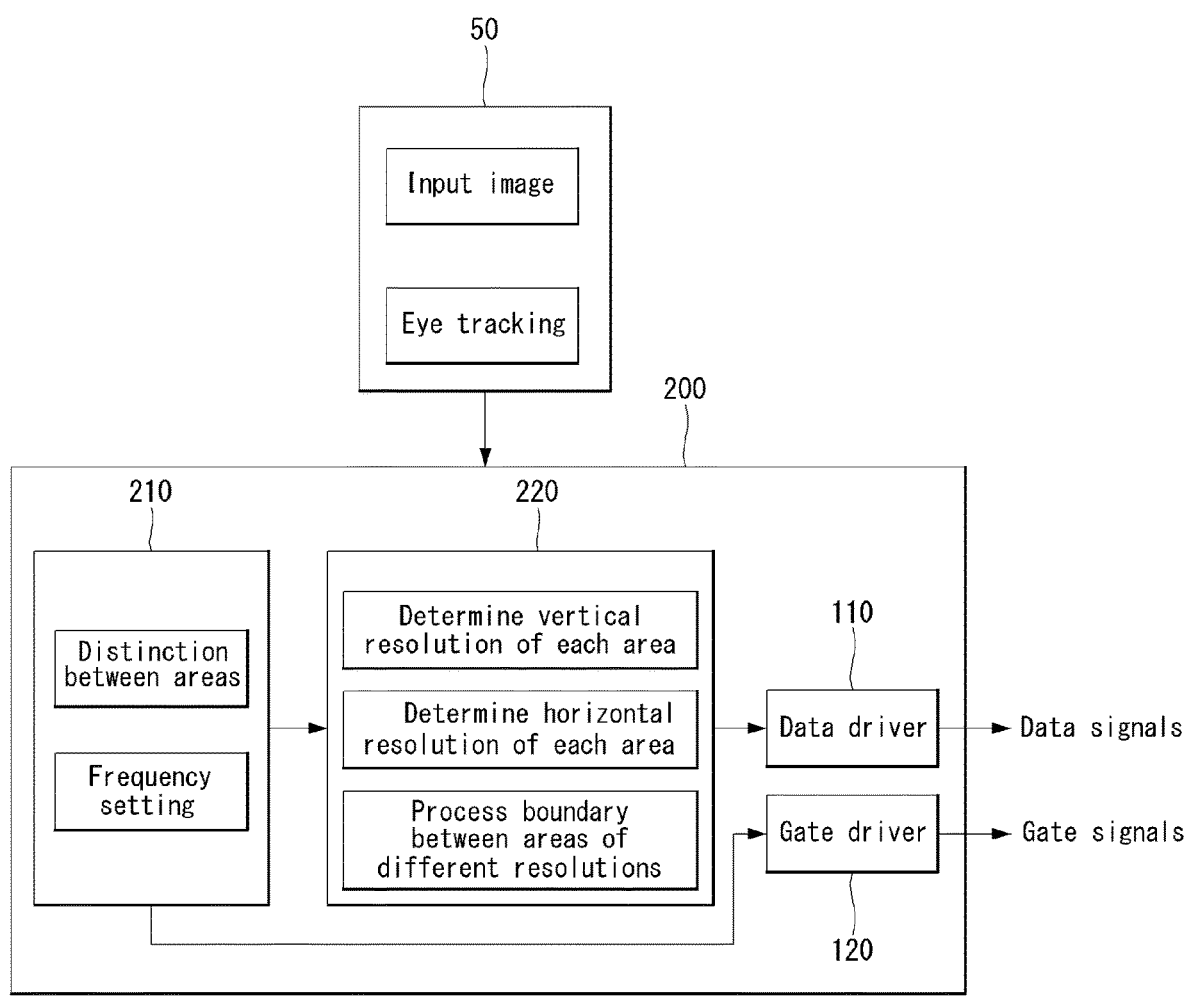
FIGS. 7 and 8 are views showing in detail the operations of the system controller and display driver.

As shown in FIG. 7, the display driver 200 receives an eye tracking result indicating position information of the focal area and the foveated-rendered input image from the system controller 50. The display driver 200 divides 1 frame data of an input image between the focal area, the neighboring area, and the peripheral area, based on the position information of the focal area. The display driver 200 writes the image data received from the system controller 50 to the pixels on the display panel 100. The display driver 200 comprises a timing controller 130, a data driver 110, and a gate driver 120, as shown in FIG. 3.

In the case of a virtual reality device, the display driver 200 distinguishes the focal area and the neighboring area on each of the display panels 100A and 100B, and sets the frame rate of the display panels 100A and 100B at a frequency equal to or higher than the input frame rate of the image data received from the system controller 50. The display driver 200 decreases the number of shifts in gate signals applied to the gate lines in the neighboring area, compared to that in the focal area.

The display driver 200 writes data of an input image to the display panels 100A and 100B. The display driver 200 comprises a data driver 110, a gate driver 120, and a timing controller 130 in each of the display panels 100A and 100B. The data drivers 110 of the display panels 100A and 100B may share a single timing controller 130, as shown in FIG. 3.

The data driver 110 converts data of an input image to gamma-compensated voltages to generate voltages (data voltages) of analog data signals and outputs the data voltages to the data lines 102. The gate driver 120 outputs gate signals (or scan signals) synchronized with the data voltages to the gate lines 104.

The gate driver 120 comprises a shift register for shifting pulses of gate signals and sequentially supplying the gate signals to the gate lines. The gate driver 120 shifts the gate signals output to the gate lines under control of the timing controller 130. Particularly, the gate driver 120 adjusts the number of shifts in the focal area, the neighboring area, and the peripheral area, individually. The number of shifts in gate signals is proportional to the resolution of each area. The larger the number of shifts in gate signals, the higher the resolution because different data is written to neighboring pixels. The number of shifts in gate signals in the focal area (hereinafter, "the number of gate shifts") is larger than those in the neighboring area and peripheral area. The number of gate shifts in the neighboring area is larger than that in the peripheral area.

The timing controller 130 sends data of an input image received from the system controller 50 to the data driver 110. The timing controller 130 receives timing signals synchronized with the input image data from the system controller 50, and controls the operation timings of the data driver 110 and gate driver 120 based on these timing signals. The timing controller 130 controls the gate driver 120 so that the number of gate shifts in the focal area, neighboring area, and peripheral area is adjusted in proportion to the resolution of each area.

The timing controller 130 may control the driving frame rate of the display panel 100 to be a driving frame rate having a frequency equal to or higher than the frame rate (input frame rate) of an input image received from the system controller 50 by decreasing the number of gate shifts in the neighboring area and the peripheral area. The input frame rate is 60 Hz in the NTSC (National Television Standards Committee) system and 50 Hz in the PAL (Phase-Alternating Line) system.

FIGS. 4 and 5 are views showing gate signals in the focal area, the neighboring area, and the peripheral area.

Referring to FIG. 4, the pulse width of a gate signal may be set to 1 horizontal period 1H. 1 horizontal period 1H is the period of time in which data is written to 1 pixel line of pixels. One gate line is connected to pixels arranged on one pixel line to select the pixel line to which data is written by applying a gate signal from the gate driver 120 to the pixels.

The focal area provides sharp images of high resolution to the user since the user's gaze is directed toward it. Gate signals applied to gate lines G9 to G12 formed in the focal area are sequentially shifted, one line for each horizontal period. For instance, in the example of FIG. 4, a gate signal synchronized with a data signal for a ninth pixel line is supplied to a ninth gate line G9, and then a gate signal synchronized with a data signal for a tenth pixel line is supplied to a tenth gate line G10. In this way, the gate signals are shifted in the order: G9, G10, G11, and G12, and the gate signals are sequentially supplied to the gate lines G9 to G12. Accordingly, discrete data can be written to each of the pixel lines in the focal area, so the pixels in the focal area display an image at 100% resolution.

The neighboring area provides images of relatively a high-resolution since it is close to the focal area. Gate signals applied to gate lines G5 to G8 and G13 to G16 in the neighboring area may be shifted once every two pixel lines since two pixel lines are scanned simultaneously. For example, the gate driver 120 may supply a first gate signal simultaneously to the fifth and sixth gate lines G5 and G6 and then a second gate signal, which is generated subsequent to the first gate signal, simultaneously to the seventh and eighth gate lines G7 and G8, under control of the timing controller 130. When a gate signal is supplied simultaneously to two gate lines, the number of gate shifts is reduced to half. Thus, when the neighboring area and the focal area are of the same size, the scanning time required for scanning all the pixels in the neighboring area is reduced to half the scanning time for the focal area.

The reduction in the scanning time in the neighboring area may shorten the frame period, which may increase the frame rate. The frame period for writing 1 frame data to all the pixels on the screen is determined according to the frame rate. The frame rate may also be construed as having the same meaning as a refresh rate. When a gate signal is applied simultaneously to two gate lines, the same data is written to the two pixel lines connected to the gate lines, and therefore the resolution is reduced to half. Since the user's gaze is directed toward the focal area, the user will not perceive a decline in resolution in the neighboring area unless the resolution in the neighboring area is too low.

Since the peripheral area is far from the focal area, the user is not very sensitive to the resolution in the peripheral area. Due to this, the user perceives little degradation of picture quality in the peripheral area even though the peripheral area has a lower resolution than the neighboring area. Gate signals applied to gate lines G1 to G4 and G17 to G20 in the peripheral area may be shifted once every four pixel lines since four pixel lines are scanned simultaneously. For example, the gate driver 120 supplies the first gate signal simultaneously to the first to fourth gate lines G1 to G4, and then a second gate signal, which is generated subsequent to the first gate signal, simultaneously to the gate lines G17 to G20, under control of the timing controller 130. When a gate signal is supplied simultaneously to four gate lines, the number of gate shifts is reduced to ¼. Thus, when the peripheral area and the focal area are of the same size, the scanning time required for scanning all the pixels in the peripheral area is reduced to ¼ of the scanning time for the focal area.

The reduction in the scanning time in the peripheral area may shorten the frame period, which may increase the frame rate. When a gate signal is applied simultaneously to four gate lines, the same data is written to the four pixel lines connected to the gate lines, and therefore the resolution is reduced to ¼. Since the user's gaze is directed toward the focal area, the user is less sensitive to the resolution of the peripheral area, which is far from the focal area, than in the neighboring area.

FIG. 5 shows an example in which the user shifts their gaze and the focal area FA is shifted down.

Referring to FIG. 5, the gate signals applied to the gate lines G13 to G16 in the focal area FA are shifted for each pixel line. In the focal area FA, discrete data is written to each of the pixels P1 to P4. The focal area FA displays an image at 100% resolution in both horizontal (x) and vertical (y) directions.

The gate signals applied to the gate lines G9 to G12 and G17 to G20 in the neighboring area NA are shifted once every two pixel lines. For example, a first gate pulse may be applied simultaneously to the ninth and tenth gate lines G9 and G10, and a second gate pulse may be applied simultaneously to the eleventh and twelfth gate lines G11 to G12. Thus, the resolution in the vertical direction (y) may be reduced to half. That is, the same data may be written to two neighboring pixels in the neighboring area NA, and the resolution in the horizontal direction (x) may be therefore reduced to half. For example, the same data as the first pixel P1 is replicated to the second pixel P2, and the same data as the third pixel P3 is replicated to the fourth pixel P4. Accordingly, the neighboring area NA displays an image at 50% resolution in both horizontal (x) and vertical (y) directions. Since the number of gate shifts in the neighboring area NA is reduced to half that in the focal area FA, the scanning time for the neighboring area NA may be reduced by that amount.

The gate signals applied to the gate lines G1 to G8 in the peripheral area UA are shifted once every four pixel lines. For example, a first gate pulse may be applied simultaneously to the first to fourth gate lines G1 and G4, and a second gate pulse may be applied simultaneously to the fifth to eighth gate lines G5 to G8. Thus, the resolution in the vertical direction (y) may be reduced to ¼. That is, the same data may be written to four neighboring pixels in the peripheral area UA, and the resolution in the horizontal direction (x) may be therefore reduced to ¼. For example, the same data as the first pixel P1 is replicated to the second to fourth pixels P2 to P4, and the same data as the fifth pixel is replicated to the sixth to eighth pixels (not shown). Accordingly, the peripheral area UA displays an image at 25% resolution in both horizontal (x) and vertical (y) directions. Since the number of gate shifts in the peripheral area UA is reduced to ¼ of that in the focal area FA, the scanning time for the peripheral area UA may be reduced by that amount.

Figure 6:
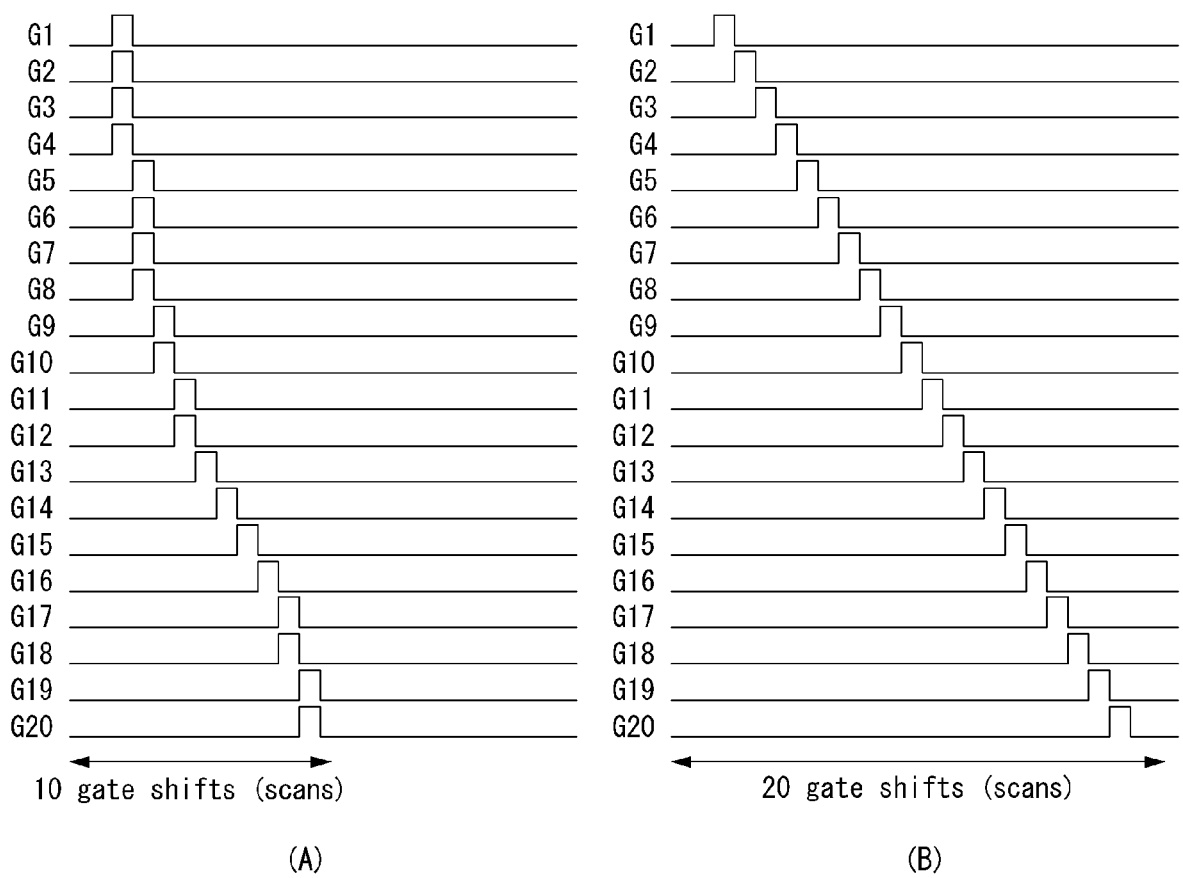
FIG. 6 is a comparison chart showing how gate signals are shifted in the focal area, the neighboring area, and the peripheral area in an exemplary aspect of the present disclosure and a comparative example.

FIG. 6 is a comparison chart showing how gate signals are shifted in the focal area, neighboring area, and peripheral area in an exemplary aspect (A) of the present disclosure and a comparative example (B). In the comparative example (B), gate signals are shifted for each of all the gate lines G1 to G20, in order to achieve 100% resolution across the screen.

Referring to FIG. 6, in the exemplary aspect (A) of the present disclosure, the number of gate shifts is decreased to match the resolutions of the neighboring area NA and peripheral area UA defined on the display panel 100 by the system controller 50. In the comparative example (B), gate signals are shifted for each line to match 100% resolution in both the focal area and the neighboring area. The number of gate shifts in the comparative example (B) is 20.

Even if the system controller 50 decreases the resolution of the neighboring area compared to the focal area, the number of gate shifts cannot be reduced when gate signals are shifted for each line as in the comparative example, and therefore the frame rate cannot be increased. In contrast, in the present disclosure, the driving frame rate of the display panel 100 is controlled to be at a frequency equal to or higher than the input frame rate by decreasing the number of gate shifts in the neighboring area and peripheral area, for which the user is not very sensitive to changes in resolution. Thus, the latency until data is written to the pixels can be reduced, thereby improving motion judder and motion blur. The display device of this disclosure may vary the resolution perceived by the user according to area without physically changing the resolution of the display panel, by adjusting the number of gate shifts on the display panel in proportion to the resolution of the focal area toward which the user's gaze is directed and the resolution of the neighboring area.

Figure 8:
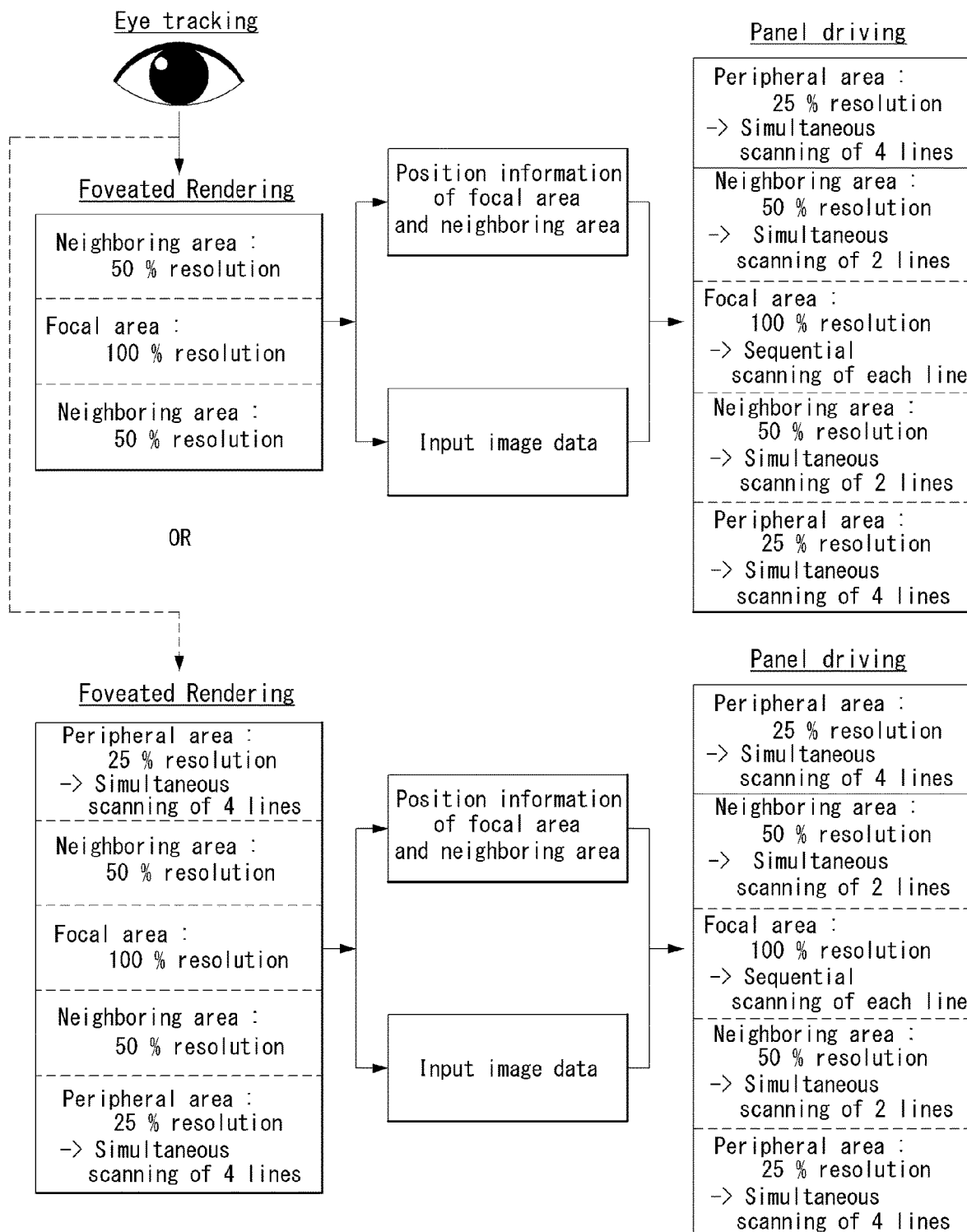

FIGS. 7 and 8 are views showing in detail the operations of the system controller 50 and the display driver 200.

Referring to FIGS. 7 and 8, the system controller 50 sends to the display driver 200 position information of the focal area and position information of the neighboring area, which are estimated through eye tracking. Along with the position information of the focal area and neighboring area, the system controller 50 sends to the display driver 200 data of an input image whose resolution is adjusted according to area by a foveated rendering algorithm. The position information of the focal area and neighboring area comprises coordinate values on the screen. Because the focal area moves in response to the movement of the user's eye, the position information of the focal area and neighboring area is updated for each frame and sent to the display driver 200. The system controller 50 may adjust the resolution differently for the focal area, neighboring area, and peripheral area and send it to the display driver 200.

The display driver 200 further comprises first and second image processors 210 and 220. The first and second image processors 210 and 220 may be provided within the timing controller 130.

The first image processor 210 distinguishes the focal area, the neighboring area, and the peripheral area and determines the frame rate, based on the position information of the focal area and neighboring area on the display panel 100. The area other than the focal area and the neighboring area may be determined as the peripheral area on the screen. The sizes and ratios of the focal area, the neighboring area, and the peripheral area may be preset to fixed values or may be varied as in the examples of FIGS. 10A and 11.

In a case where the system controller 50 divides the screen into a focal area and a neighboring area, the first image processor 210 may distinguish the focal area and the neighboring area on the screen and additionally set a peripheral area having a lower resolution than the neighboring area. By setting a peripheral area whose number of shifts in gate signals is the lowest, the driving frame rate of the display panel 100 is further increased.

The first image processor 210 is able to increase the driving frame rate of the display panel 100 to be at a frequency higher than the input frame rate of an input image received by the display driver 200, as shown in FIGS. 9 and 11, by decreasing the scanning time by reducing the number of gate shifts in the neighboring area and peripheral area. The first image processor 210 increases the frequency of an input vertical synchronization signal Vsync received from the system controller 50 by modulating the vertical synchronization signal to the driving frame rate of the display panel 100. In FIGS. 9 and 11, Vsync denotes a vertical synchronization signal generated in the normal driving mode, and Vsync' denotes a modulated vertical synchronization signal output from the first image processor 210. One cycle of the vertical synchronization signals Vsync and Vsync' defines 1 frame period.

The first image processor 210 generates a gate timing control signal based on the driving frame rate of the display panel 100. The gate timing control signal comprises a start pulse, a shift clock, a selection signal SEL, etc. The start pulse is generated once at the beginning of each frame, and supplies it to a VST terminal (start terminal) of the first stage of the shift register in the gate driver 120 that generates a first output. The start pulse defines the start timing of the gate driver 120. The shift clock controls the shift timing of the shift register. The selection signal SEL selects between sequential scanning and simultaneous scanning by controlling a multiplexer connected between neighboring stages of the shift register and selectively changing the path of carry signals applied to the VST terminals of the stages. The first image processor 210 may select between sequential scanning and simultaneous scanning according to area by adjusting the number of gate shifts in the focal area, neighboring area, and peripheral area by using the selection signal SEL.

The first image processor 210 controls the gate driver 120 so as to simultaneously output a plurality of gate signals in the neighboring area and peripheral area, and controls the gate driver 120 so that the number of shifts in gate signals in the focal area matches the vertical resolution of the display panel 100. In the focal area, gate signals are shifted for each pixel line. Since the focal area moves in response to the movement of the user's eye, the resolution of the screen may vary with position for each frame period.

The second image processor 220 adjusts the resolution of an input image in vertical and horizontal directions to match a resolution of the display panel 100. In the neighboring area and the peripheral area, the resolution is decreased by replicating input data to neighboring pixels.

Figure 19:
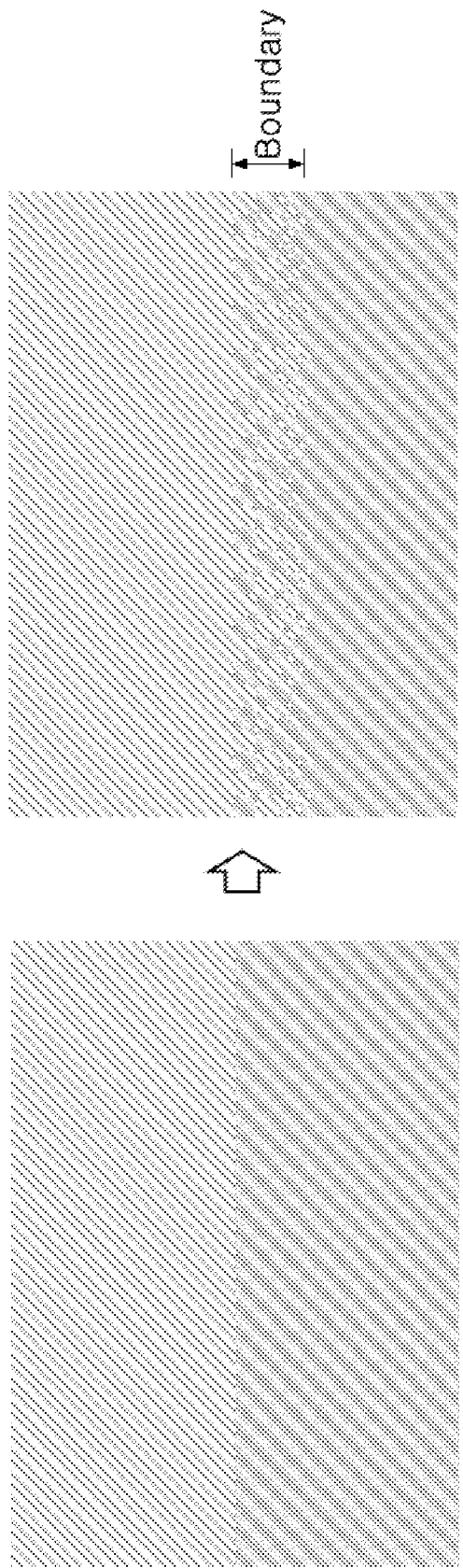

The second image processor 220 processes the image at the boundary BD as in the examples of FIGS. 19 and 20, so as to keep the boundary of each area from being perceived by the user. For example, the second image processor 220 may allow the boundary of the focal area and neighboring area to alternate between the resolution of the focal area and the resolution of the neighboring area, or may shift the boundary up and down on the time axis.

The second image processor 220 sends to the data driver 110 data of an input image whose resolution is adjusted according to area. By using a digital-to-analog converter DAC, the data driver 110 converts the data from the second image processor 220 to analog data signals and outputs them to the data lines 102.

In FIGS. 7 and 8, the focal area estimation function and the area-specific resolution conversion function of the system controller 50 may be implemented within the display driver 200. Inversely, the image processors 210 and 220 of the display driver 200 may be implemented in the system controller 50.

FIG. 9 is a waveform chart showing a vertical synchronization signal Vsync generated at an input frame rate and vertical synchronization signals Vsync' generated at the driving frame rate of the display panel 100. In the display driver 200, the sizes (or screen ratios) of the focal area and neighboring area may be preset to fixed values. In this case, as shown in FIG. 9, the driving frame rate of the display panel 100 in normal driving mode and area-specific driving mode is higher than or equal to the input frame rate. When the sizes of the focal area and neighboring area are fixed, the frame period and the frame rate are fixed. For example, the driving frame rate of the display panel 100 may be set to any of the following: 90 Hz, 110 Hz, and 120 Hz, depending on the sizes of the focal area and neighboring area. The smaller the focal area, the higher the frame rate, and latency is reduced.

Figure 10A:
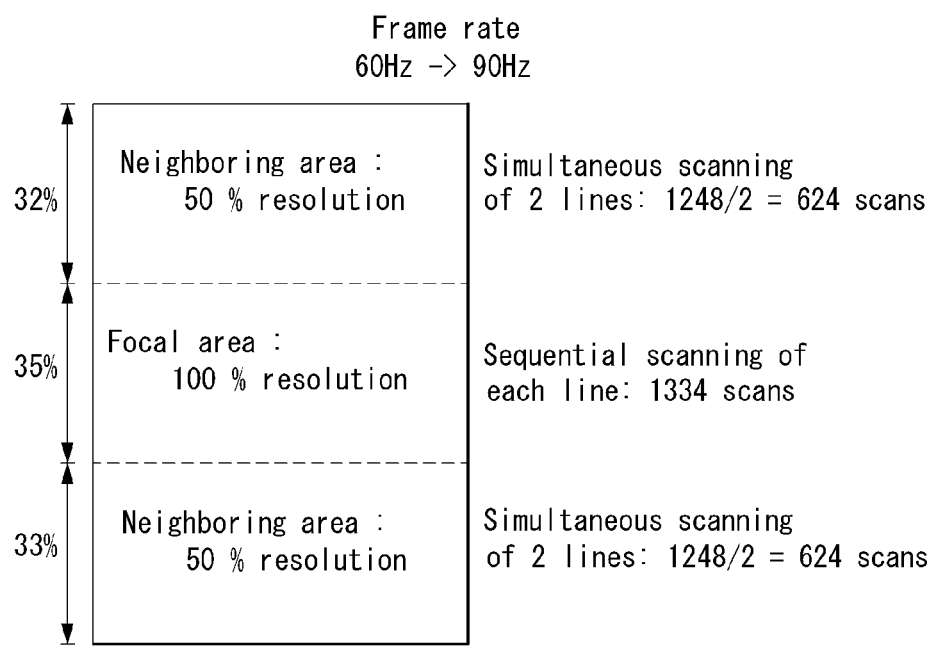
Figure 10B:
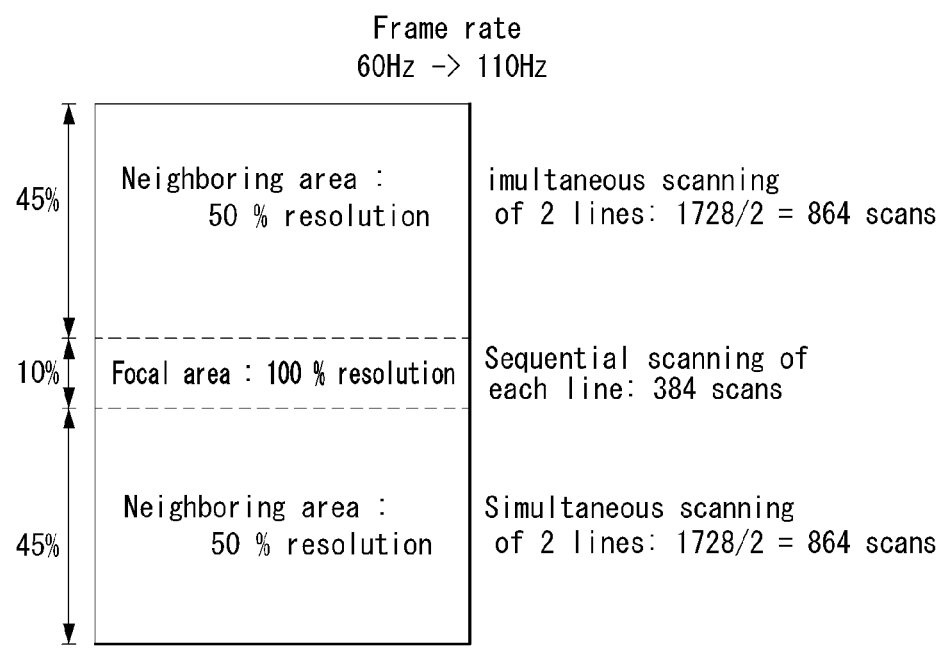

In the present disclosure, in the area-specific driving mode, the size of the focal area may be varied based on the movement of an input image or of the user's head and the contents of the input image, and accordingly, the frame rate may be varied, as shown in FIGS. 10A to 10C. Also, the size of the neighboring area may be varied along with the focal area. For example, when the user's gaze is directed toward a moving object in the input image, the faster the object moves, the smaller the display driver 200 shrinks the size of the focal area. The faster the object is moving, the lower the perceived resolution of the object, and the user will hardly perceive a change in resolution. Likewise, when the user's head moves fast, the perceived resolution of the screen is decreased, making it difficult for the user to perceive a change in resolution. Moreover, the more the number of moving objects on the screen, the lower the perceived resolution of the screen. Accordingly, the present disclosure can further reduce latency by allowing for much faster frame rates by reducing the focal area without a decline in picture quality.

FIGS. 10A to 10C are views each showing an example of variation of the driving frame rate of the display panel.

Referring to FIGS. 10A to 10C, in the present disclosure, the driving frame rate of the display panel 100 may be varied depending on the ratio of the focal area and the neighboring area. When the focal area is 10% of the size of the screen, the number of gate shifts may be the smallest.

FIG. 10A shows an example in which the focal area is set to a size of 35% of the screen. With the absence of the peripheral area, the neighboring area, which is divided in two with the focal area in between, takes up 65%. The pixel lines in the focal area are sequentially scanned line by line as gate signals are shifted for each line. In the neighboring area, a plurality of pixel lines may be scanned simultaneously as a gate signal is applied simultaneously to a plurality of gate lines. In FIG. 10A, every two pixel lines are scanned simultaneously in the neighboring area. In the display panel driving method of FIG. 10A, the total scan count, i.e., the number of gate shifts, is 2,592 in the UHD (3840×2160) standard. In the UHD (3840×2160) standard, "3840" is vertical resolution, and "2160" is horizontal resolution. In this case, the display panel 100 may be driven at a frame rate of 90 Hz.

The ratio of the focal area to the screen may be varied based on the movement of an input image or the user's head. FIG. 10B shows an example in which the focal area is reduced to 10%. With the absence of the peripheral area, the neighboring area, which is scanned by simultaneous scanning, is increased to 90% by the amount of reduction of the focal area. The pixel lines in the focal area are sequentially scanned line by line as gate signals are shifted for each line. In the neighboring area, a plurality of pixel lines may be scanned simultaneously as a gate signal is applied simultaneously to a plurality of gate lines. In FIG. 10B, every two pixel lines are scanned simultaneously in the neighboring area. In the display panel driving method of FIG. 10B, the total scan count, i.e., the number of gate shifts, is 2,112 in the UHD (3840×2160) standard. In this case, the display panel 100 may be driven at a frame rate of 110 Hz.

FIG. 10C shows an example in which the focal area is converted to a size of 20% of the screen. The neighboring area, which is divided in two with the focal area in between, takes up 40%, and the peripheral area takes up 40%. The pixel lines in the focal area are sequentially scanned line by line as gate signals are shifted for each line. In the neighboring area and peripheral area, a plurality of pixel lines may be scanned simultaneously as a gate signal is applied simultaneously to a plurality of gate lines. In the peripheral area, every four pixel lines are scanned simultaneously. In the display panel driving method of FIG. 10C, the total scan count, i.e., the number of gate shifts, is 1,920 in the UHD (3840×2160) standard. In this case, the display panel 100 may be driven at a frame rate of 120 Hz.

As can be seen from FIGS. 10A to 10C, the driving frame rate of the display panel 100 may be varied depending on the sizes of the focal area and neighboring area on the screen.

FIG. 11 is a waveform diagram showing an example of variation of the driving frame rate of the display panel.

When the sizes of the focal area and the neighboring area are varied by the display driver 200, the frame period and the frame rate are varied too. For each frame, the frame period and frame rate may be preset based on the rate at which an input image or the user's head moves. In this case, the frame rate of the display panel 100 in the area-specific driving mode may be higher than or equal to the input frame rate.

Figure 12:
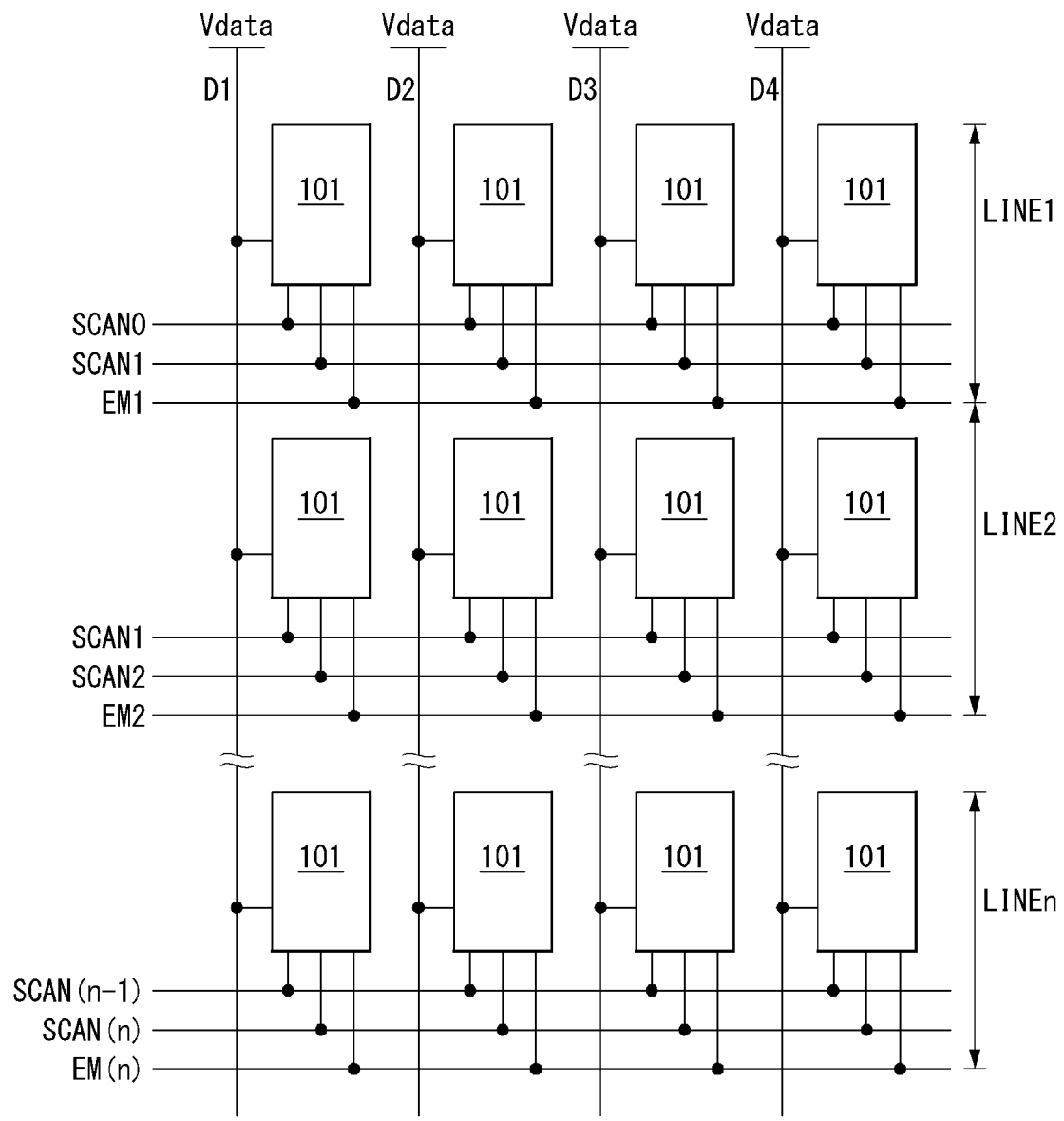
FIG. 12 is a view showing part of a pixel array.

FIG. 12 is a view showing part of a pixel array. In FIG. 12, LINE1 to LINEn represent pixel lines of pixels in a pixel array that share gate lines. LINEn is an nth pixel line (n is a positive integer). Vdata is data voltages of an input image supplied to data lines D1 to D4. SCAN0 to SCAN(n) and EM1 to EM(n) represent gate signals. In internal compensation, the gate signals are divided into scan signals SCAN0 to SCAN(n) and emission switching signals (hereinafter, "EM signals") EM1 to EM(n).

In this pixel circuit, variations in the electrical characteristics of individual pixels may be compensated for in real time by internal compensation. In the internal compensation method, variations in the electrical characteristics of driving elements may be compensated for in real time. In the internal compensation method, sub-pixels are driven in a reset phase Tini, a sensing and data writing phase Twr, and a driving phase Tem.

FIG. 13 is a waveform chart showing an example of a pixel circuit and gate signals for driving the pixel circuit.

Referring to FIG. 13, the (N−1)th scan signal SCAN(N−1) (N is a positive integer) is generated as a pulse of gate-on voltage in the reset phase Tini to define the reset phase Tini. In the reset phase Tini, primary nodes of the pixel circuit are reset. The Nth scan signal SCAN(N) is generated as a pulse of gate-on voltage in the sensing and data writing phase Twr to define the sensing and data writing phase Twr. In the sensing and data writing phase Twr, a data voltage Vdata is applied to the pixel circuit through a data line, an electrical characteristic, e.g., threshold voltage, of the driving element in the pixel circuit is sensed, and the gate-source voltage of the driving element is set to a data voltage compensated by the threshold voltage. In the driving phase Tem, current flows to the light-emitting element through the driving element in the pixel circuit, causing the light-emitting element to emit light. The EM signal EM(N) maintains gate-on voltage in the driving phase Tem and is generated as a pulse of gate-off voltage in the reset phase Tini and the sensing and data writing phase Twr.

The pixel circuit comprises a light-emitting element EL, a driving element DT, a storage capacitor Cst, and a plurality of switching elements T1 to T6. The driving element DT and the switching elements T1 to T6 may be implemented as, but not limited to, PMOS TFTs. In this pixel circuit, power supply voltages such as high-potential pixel driving voltage VDD, reset voltage Vini, and low-potential power supply voltage VSS are generated from a power circuit (not shown). The power supply voltages may be set to, but not limited to, VDD=4.5 V, VSS=−2.5 V, Vini=−3.5 V, VGH=7.0 V, and VGL=−5.5 V. The power supply voltages may vary depending on the driving characteristics or model of the display panel 100.

The light-emitting element EL may be implemented as an OLED. The OLED comprises organic compound layers formed between an anode and a cathode. The organic compound layers may comprise, but not limited to, a hole injection layer HIL, a hole transport layer HTL, an emission layer EML, an electron transport layer ETL, and an electron injection layer EIL. When the OLED is turned on, a hole passing through the hole transport layer HTL and an electron passing through the electron transport layer ETL move to the emission layer EML, forming an exciton. As a result, the emission layer EML generates visible light. The OLED emits light by an electric current that is regulated by the gate-source voltage Vgs of the driving element DT. The anode of the OLED is connected to the third and sixth switching elements T3 and T6 via a fifth node n5. The cathode of the OLED is connected to a VSS electrode to which VSS is applied. The current path of the OLED is switched by the fourth switching element T4.

The first electrode of the storage capacitor Cst is connected to VDD wiring 103 and is supplied with VDD. The second electrode of the storage capacitor Cst is connected to a gate of the driving element DT, a first electrode of the third switching element T3, and a first electrode of the fifth switching element T5 via a first node n1.

The first switching element T1 turns on in response to the Nth scan signal SCAN(N) in the sensing and data writing phase Twr and supplies a data voltage VData to a second node n2. The second node n2 is formed between a first electrode of the first switching element T1, a second electrode of the second switching element T2, and a first electrode of the driving element DT. The first switching element T1 comprises a gate connected to a second gate line 1042 to which the Nth scan signal SCAN(N) is applied, a first electrode connected to the second node n2, and a second electrode connected to a data line 102.

The second switching element T2 turns on in response to the EM signal EM(N) in the driving phase Tem, and connects the VDD wiring 103 to which VDD is applied to the second node n2. The second switching element T2 comprises a gate connected to a third gate line 1043 to which the EM signal EM(N) is applied, a first electrode connected to the VDD wiring 103, and a second electrode connected to the second node n2.

The third switching element T3 turns on in response to the Nth scan signal SCAN(N) in the sensing and data writing phase Twr, and connects the first node n1 to the third node n3. The third node n3 is formed between a second electrode of the third switching element T3, a second electrode of the driving element DT, and a first electrode of the fourth switching element T4. The third switching element T3 comprises a gate connected to the second gate line 1042 to which the Nth scan signal SCAN(N) is applied, a first electrode connected to the first node n1, and a second electrode connected to the third node n3. The third switching element T3 may be implemented as a dual-gate TFT which is advantageous in eliminating leakage current that flows in the off state of the TFT.

The fourth switching element T4 turns on in response to the EM signal EM(N) in the driving phase Tem, and connects the third node n3 to the fifth node n5. The fourth switching element T4 comprises a gate connected to the third gate line 1043 to which the EM signal EM(N) is applied, a first electrode connected to the third node n3, and a second electrode connected to the anode of the light-emitting element EL via the fifth node n5. The fourth switching element T4 may be implemented as a dual-gate TFT which is advantageous in eliminating leakage current that flows in the off state of the TFT.

The fifth switching element T5 turns on in response to the (N−1)th scan signal SCAN(N−1) in the reset phase Tini, and connects the first node n1 to a fourth node n4 to which Vini is applied. The fifth switching element T5 comprises a gate connected to a first gate line 1041 to which the (N−1)th scan signal SCAN(N−1) is applied, a first electrode connected to the first node n1, and a second electrode connected to the fourth node n4. The fourth node n4 is formed on Vini wiring 105 between a second electrode of the fifth switching element T5 and a first electrode of the sixth switching element T6.

The sixth switching element T6 turns on in response to the Nth scan signal SCAN(N) in the sensing and data writing phase Twr, and connects the fourth node n4 to the fifth node n5. The sixth switching element T6 comprises a gate connected to the second gate line 1042 to which the Nth scan signal SCAN(N) is applied, a first electrode connected to the fourth node n4, and a second electrode connected to the fifth node n5.

The threshold voltage Vth of the driving element DT is stored in the storage capacitor Cst and sampled in the sensing and data writing phase Twr. In the driving phase Tem, the driving element DT adjusts the current flowing through the light-emitting element EL by the gate-source voltage Vgs. The driving element DT comprises a gate connected to the first node n1, a first electrode connected to the second node n2, and a second electrode connected to the third node n3.

Figure 14:
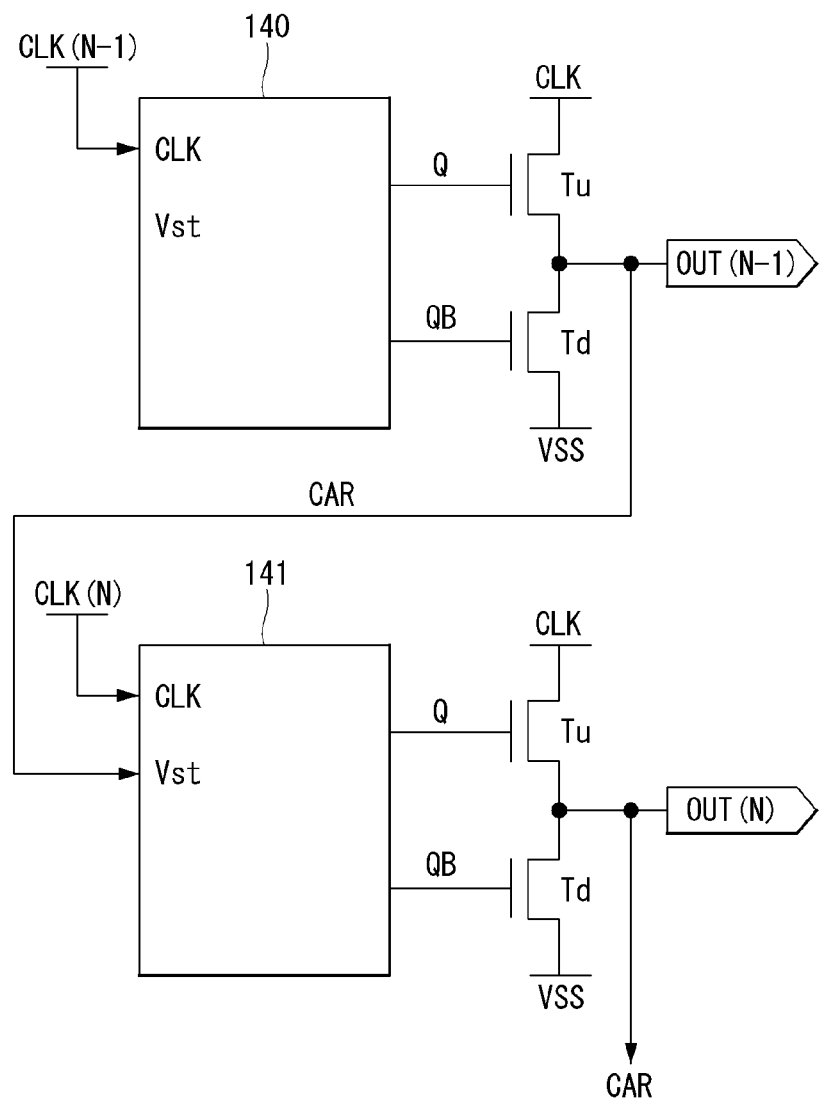
FIG. 14 is a circuit diagram schematically showing a gate driver according to an exemplary aspect of the present disclosure.

The gate driver 120 of the present disclosure comprises a shift register that is formed directly on the same substrate as a TFT (thin-film transistor) array in an active region constituting the screen. The gate driver 120 may sequentially supply gate signals including scan signals and EM signals to the gate lines 104 by shifting the signals by using the shift register. As shown in FIG. 14, the shift register comprises a plurality of stages connected as a cascade through carry signal wiring.

Figure 15:
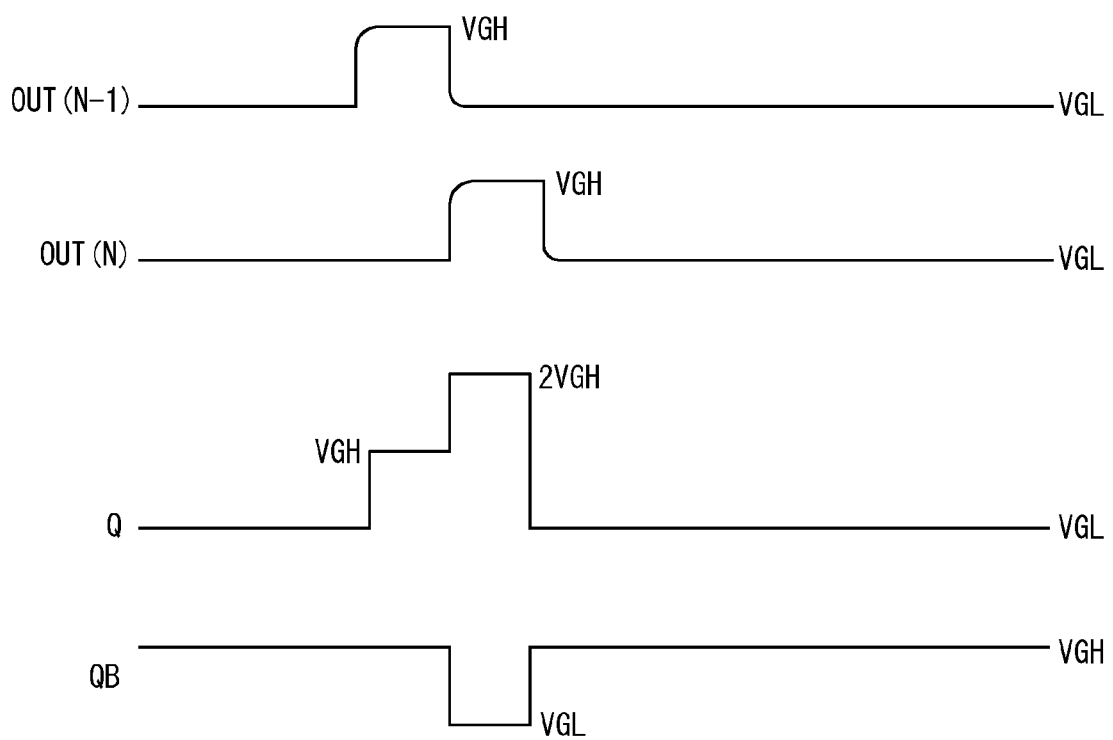
FIG. 15 is a waveform diagram of the Q node voltage, QB node voltage, and output voltages of FIG. 14.

FIG. 14 is a circuit diagram schematically showing a gate driver according to an exemplary aspect of the present disclosure. FIG. 15 is a waveform diagram of the Q node voltage, QB node voltage, and output voltages of FIG. 14. The gate driver and its driving waveforms shown in FIGS. 14 and 15 are an example in which the transistors of the shift register are implemented as NMOS.

Referring to FIGS. 14 and 15, each of the stages of the shift register receives a start pulse or a carry signal CAR from the previous stage as the start pulse and produces output upon receipt of a shift clock CLK(N−1) or CLK(N). Accordingly, the output waveforms are shifted in synchronization with the timing of the shift clocks CLK(N−1) and CLK(N) that are input into the stages. The (N−1)th stage generates an (N−1)th output voltage OUT(N−1) of gate-on voltage upon receipt of the (N−1)th clock CLK(N−1). The Nth stage generates an Nth output voltage OUT(N) of gate-on voltage upon receipt of the Nth clock CLK(N).

Each of the stages comprises a pull-up transistor Tu that pulls up the output voltage OUT(N−1) or OUT(N) by charging an output node in response to a Q node voltage, a pull-down transistor Td that pulls down the output voltage OUT(N−1) or OUT(N) by discharging the output node in response to a QB node voltage, and a switching circuit 140 or 141 for charging and discharging the Q node and the QB node. The output node of each stage is connected to a gate line on the display panel 100.

The pull-up transistor Tu charges the output node upon receipt of the shift clock CLK(N−1) or CLK(N) while the Q node is in a pre-charged state. When the Q node is pre-charged with VGH and floating, the shift clock CLK(N−1) or CLK(N) is input into the first electrode of the pull-up transistor Tu. Thus, when the shift clock CLK(N−1) or CLK(N) is input, the voltage at the Q node is boosted to a voltage higher than the pre-charging voltage, up to approximately 2VGH, by bootstrapping through the parasitic capacitance of the pull-up transistor Tu, thereby causing the pull-up transistor Tu to turn on. An output waveform is generated which is similar in shape to the shift clock CLK(N−1) or CLK(N) applied to the pull-up transistor Tu.

When the QB node is charged, the pull-down transistor Td connects the output node to a VSS node to which gate-off voltage VGL is applied, in order to discharge the output voltage OUT(N−1) or OUT(N) down to gate-off voltage VGL.

Each of the switching circuit 140 and 141 charges the Q node in response to a start pulse input via the Vst terminal or a carry signal received from the previous stage, and discharges the Q node in response to a signal received via an RST terminal or VNEXT terminal (not shown). A reset signal for simultaneously discharging the Q nodes of all the stages is applied to the RST terminal. A carry signal generated from the next stage is applied to the VNEXT terminal in order to discharge the Q node.

The QB node is connected to the gate of the pull-down transistor Td. The QB node is charged and discharged as opposed to the Q node. The pull-down transistor Td is turned on according to the QB node voltage to discharge the output node.

In the present disclosure, the focal area is sequentially scanned line by line, whereas, in the neighboring area and peripheral area, a number of lines are simultaneously scanned. To this end, the gate driver 120 comprises multiplexers (MUX) 151 to 156 that switch the path of carry signals and output signals, as shown in FIGS. 16 to 18. In the focal area (first area), the multiplexers 151 to 156 supply the output voltage of the previous stage to the start terminal Vst of the next stage connected to the previous stage. In the neighboring area or peripheral area (second area), the multiplexes 151 to 156 supply the output voltage of the previous stage simultaneously to the start terminals Vst of a plurality of stages.

FIG. 16 is a circuit diagram showing in detail a circuit in a gate driver that outputs gate signals to the gate lines in the focal area. The operation of the gate driver will be described with an example in which first and second gate lines to which a scan signal is applied are connected to one pixel line.

Referring to FIG. 16, an (N−1)th output voltage OUT(N−1) from an (N−1)th switching circuit is supplied to the first gate line of an Nth pixel line. An Nth output voltage OUT(N) from an Nth switching circuit 141 is supplied to the second gate line of the Nth pixel line. The Nth switching circuit 141 outputs the Nth output voltage OUT(N) upon receipt of an Nth clock.

The first multiplexer 151 feeds the Nth output voltage OUT(N) from the Nth switching circuit 141 to the first gate line of an (N+1)th pixel line, in response to a selection signal SEL. The second multiplexer 152 feeds the Nth output OUT(N) from the Nth switching circuit 141 to the Vst terminal of the (N+1)th switching circuit 142, in response to the selection signal SEL. As a result, the (N+1)th switching circuit 142 outputs an (N+1)th output voltage OUT(N+1) to the second gate line of the (N+1)th pixel line upon receipt of an (N+1)th clock.

An (N+1)th output voltage OUT(N+1) from an (N+1)th switching circuit 142 is supplied to the first gate line of an (N+2)th pixel line. An (N+2)th output voltage OUT(N+2) from an (N+2)th switching circuit 143 is supplied to the second gate line of the (N+2)th pixel line. The (N+2)th switching circuit 143 outputs the (N+2)th output voltage OUT(N+2) upon receipt of an (N+2)th clock.

The third multiplexer 153 feeds the (N+2)th output voltage OUT(N+2) from the (N+2)th switching circuit 143 to the first gate line of an (N+3)th pixel line, in response to the selection signal SEL. The fourth multiplexer 154 feeds the (N+2)th output voltage OUT(N+2) from the (N+2)th switching circuit 143 to the Vst terminal of the (N+3)th switching circuit 144, in response to the selection signal SEL. As a result, the (N+3)th switching circuit 144 outputs an (N+3)th output voltage OUT(N+3) to the second gate line of the (N+3)th pixel line upon receipt of an (N+3)th clock.

In this way, the output waveforms from the gate driver 120 are shifted once per pixel line in the focal area.

FIG. 17 is a circuit diagram showing in detail a circuit in a gate driver that outputs gate signals to the gate lines in the neighboring area.

Referring to FIG. 17, an (N−1)th output voltage OUT(N−1) from an (N−1)th switching circuit is supplied to the first gate line of an Nth pixel line. An Nth output voltage OUT(N) from an Nth switching circuit 141 is supplied to the second gate line of the Nth pixel line. The Nth switching circuit 141 outputs the Nth output voltage OUT(N) upon receipt of an Nth clock.

The first multiplexer 151 feeds the Nth output voltage OUT(N) from the Nth switching circuit 141 to the first gate line of an (N+1)th pixel line, in response to a selection signal SEL. The second multiplexer 152 feeds the (N−1)th output voltage OUT(N−1) to the Vst terminal of the (N+1)th switching circuit 142, in response to the selection signal SEL. As a result, the (N+1)th switching circuit 142 outputs an (N+1)th output voltage OUT(N+1) to the second gate line of the (N+1)th pixel line upon receipt of an Nth clock. Since the (N−1)th output voltage OUT(N−1) is input simultaneously into the Vst terminals of the Nth and (N+1)th stages, the Nth output voltage OUT(N) and the (N+1)th output voltage OUT(N+1) are simultaneously output.

The (N+1)th output voltage OUT(N+1) is supplied to the first gate line of an (N+2)th pixel line. An (N+2)th output voltage OUT(N+2) from an (N+2)th switching circuit 143 is supplied to the second gate line of the (N+2)th pixel line. The (N+2)th switching circuit 143 outputs the (N+2)th output voltage OUT(N+2) upon receipt of an (N+1)th clock. That is, the (N+2)th output voltage OUT(N+2) is output immediately after the Nth and (N+1)th output voltages OUT(N) and OUT(N+1) are output simultaneously.

The third multiplexer 153 feeds the (N+1)th output voltage OUT(N+1) to the first gate line of an (N+3)th pixel line, in response to the selection signal SEL. The fourth multiplexer 154 feeds the (N+1)th output OUT(N+1) to the Vst terminal of the (N+3)th switching circuit 144, in response to the selection signal SEL. As a result, the (N+3)th switching circuit 144 outputs an (N+3)th output voltage OUT(N+3) to the second gate line of the (N+3)th pixel line upon receipt of an (N+1)th clock. Since the (N+1)th output voltage OUT(N+1) is input simultaneously into the Vst terminals of the (N+2)th and (N+3)th stages, the (N+2)th output voltage OUT(N+2) and the (N+3)th output voltage OUT(N+3) are simultaneously output.

In this way, as shown in FIG. 17, the output waveforms from the gate driver 120 are shifted once every two pixel lines in the neighboring area.

FIG. 18 is a circuit diagram showing in detail a circuit in a gate driver that outputs gate signals to the gate lines in the peripheral area. In FIG. 18, MUX is a simple representation of the multiplexers 151 to 156 of FIGS. 16 and 17.

Referring to FIG. 18, an (N−1)th output voltage OUT(N−1) from an (N−1)th switching circuit is supplied to the first gate line of an Nth pixel line. An Nth output voltage OUT(N) from an Nth switching circuit 141 is supplied to the second gate line of the Nth pixel line. The Nth switching circuit 141 outputs the Nth output voltage OUT(N) upon receipt of an Nth clock.

The multiplexer MUX feeds the (N−1)th output voltage OUT(N−1) to the first gate lines of the (N+1)th to (N+3)th pixel lines in response to a selection signal SEL. Then, the multiplexer MUX feeds the (N−1)th output voltage OUT(N−1) simultaneously to the Vst terminals of the Nth to (N+3)th switching circuits 141 to 144 in response to the selection signal SEL. As a result, the Nth to (N+3)th switching circuits 141 to 144 generate output voltages OUT(N) to OUT(N+3) simultaneously upon receipt of the Nth clock and output them to the second gate lines of the Nth to (N+3)th pixel lines.

In this way, the output waveforms from the gate driver 120 are shifted once every four pixel lines in the peripheral area.

The boundaries where the resolution changes may look sharp. To solve this problem, as shown in FIG. 19, the second image processor 220 may allow a high-resolution area and a low-resolution area to alternate with each other at the boundary by using a spatial filter so that the resolution changes gradually. In another exemplary aspect, the second image processor 220 may shift the boundary between a high-resolution area and a low-resolution area for each frame period by using a temporal filter so that the boundary between these areas is shifted up and down on the screen when viewed from the time axis. Apart from these filters, well-known image processing methods may be used to process the boundary between areas of different resolutions.

As described above, the present disclosure may greatly reduce the scanning time and frame period and increase the frame rate by decreasing the number of gate shifts in a neighboring area of a focal area toward which the user's gaze is directed, and thus may reduce the latency until data is written to the pixels, thereby improving motion judder and motion blur. The display device of the present disclosure may vary the resolution perceived by the user according to area without physically changing the resolution of the display panel, by adjusting the number of gate shifts on the display panel in proportion to the resolution of the focal area towards which the user's gaze is directed and the resolution of the neighboring area.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible for the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising: a display panel including a plurality of data lines, a plurality of gate lines and a plurality of pixels arranged in a matrix form where the plurality of data lines and the plurality of gate lines intersect with each other; a system controller sending image data of an input image to a display driver, wherein the display driver drives the display panel by decreasing the number of shifts in gate signals applied to the plurality of gate lines in a second area where the input image is displayed with a second resolution lower than a first area where the input image is displayed in a first resolution in the display panel; and wherein the display driver further drives the display panel by decreasing the number of shifts in gate signals applied to the plurality of gate lines in a third area where the image data is displayed in a third resolution than the second resolution in the display panel.

2. The display device according to claim 1, wherein the system controller or the display driver determines the first area based on a user's gaze, the second area around the first area, and respectively adjusts a resolution of the input image displayed in each of the first area and the second area to be the first resolution and the second resolution.

3. The display device according to claim 2, wherein the system controller or the display driver determines the third area other than the first area and the second area in the display panel, and adjusts a resolution of the input image displayed in the third area to be the third resolution.

4. The display device according to claim 1, wherein the display driver further comprises: a data driver converts the image data of the input image into data voltages and outputting the data voltages to the plurality of data lines; a gate driver outputting the gate signals synchronized with the data voltages to the plurality of gate lines; and a timing controller controlling operation timings of the data driver and the gate driver based on a timing signal synchronized with the image data of the input image from the system controller.

5. The display device according to claim 4, wherein the timing controller controls the gate driver so that the gate driver adjusts the number of shifts in the gate signals in the first area and the second area in proportion to the first resolution and the second resolution.

6. The display device according to claim 4, wherein the gate driver reduces the number of shifts in the gate signals in the second area by simultaneously applying the gate signals to the plurality of gate lines in the second area a greater number of gate lines than the first area.

7. The display device according to claim 6, wherein the data driver writes the same image data to a plurality of pixel lines connected with the greater number of gate lines.

8. The display device according to claim 4, wherein the display driver further comprises: a first image processor distinguishing the first area from the second area and determining a driving frame rate of the display panel, and controlling the gate driver based on the driving frame rate; and a second image processor adjusting the input image in the first area to have the first resolution and the input mage in the second area to have the second resolution, and sending the image data with the resolution adjusted to the data driver.

9. The display device according to claim 8, wherein the second image processor processes a boundary between the first area and the second area by making a resolution of an image at the boundary alternate between the first resolution and the second resolution, or by shifting the boundary between the first area and the second area in a time axis.

10. The display device according to claim 8, wherein the first image processor and the second image processor are included in the timing controller.

11. The display device according to claim 1, wherein sizes of the first area and the second area are predetermined fixed values, or are varied based on one or more of the input image's movement, a user's head movement and the input image's contents.

12. A virtual reality device including a display device according to claim 1.

13. The virtual reality device according to claim 12, wherein the display panel includes a left-eye display panel and a right-eye display panel.

14. The virtual reality device according to claim 13, wherein the left-eye display panel and the right-eye display panel shares the timing controller in the display driver.

15. A gate driving circuit for a display device, a display panel of the display device comprising a first area where an input image is displayed in a first resolution and a second area where the input image is displayed in a second resolution smaller than the first resolution, wherein the gate driving circuit comprising: a shift register shifting pulses of gate signals and sequentially supplying the gate signals to a plurality of gate lines, the shift register including a plurality of stages connected as a cascade through a carry signal wiring; and a multiplexer switching a path of an output signal of each of the plurality of stages, wherein in the first area, the multiplexer provides the output signal of a previous stage to start terminals of a first number of next stages as an carry signal, and in the second area, the multiplexer provides the output signal of a previous stage to start terminals of a second number of next stages as a carry signal, wherein the first number corresponds to the first resolution, and the second number corresponds to the second resolution; and wherein the display panel further comprises a third area where the input image is displayed in a third resolution lower than the second resolution.

16. The gate driving circuit according to claim 15, wherein, in the third area, the multiplexer provides the output signal of a previous stage to start terminals of a third number of next stages as the carry signal, wherein the third number corresponds to the third resolution.

17. The gate driving circuit according to claim 15, wherein each of the plurality of stages comprises: an output node connected to the plurality of gate lines on the display panel and outputting the output signal; a Q node and a QB node; a pulling-up transistor pulling up the output signal by charging the output node in response to a voltage at the Q node; a pulling-down transistor pulling down the output signal by discharging the output node in response to a voltage at the QB node; and a switching circuit charging the Q node in response to a start pulse or the carry signal input from the start terminal.

18. A method for controlling a gate driving circuit for a display device, a display panel of the display device including a first area where an input image is displayed in a first resolution and a second area where the input image is displayed in a second resolution lower than the first resolution, wherein the gate driving circuit including a shift register shifting pulses of gate signals and sequentially supplying the gate signals to a plurality of gate lines, the shift register including a plurality of stages connected as a cascade through a carry signal wiring; and a multiplexer switching a path of an output signal of each of the plurality of stages, wherein the method comprises: controlling the multiplexer to provide, in the first area, the output signal of a previous stage to start terminals of a first number of next stages as a carry signal; and controlling the multiplexer to provide, in the second area, the output signal of a previous stage to start terminals of a second number of next stages as the carry signal, the first number corresponding to the first resolution, and the second number corresponding to the second resolution; and wherein the display panel further comprises a third area where the input image is displayed in a third resolution lower than the second resolution.

* * * * *